(12) United States Patent
Wang et al.

(10) Patent No.: US 10,385,229 B2
(45) Date of Patent: Aug. 20, 2019

(54) NON-AQUEOUS INK COMPOSITIONS CONTAINING METALLIC NANOPARTICLES SUITABLE FOR USE IN ORGANIC ELECTRONICS

(71) Applicant: NISSAN CHEMICAL INDUSTRIES, LTD., Tokyo (JP)

(72) Inventors: Jing Wang, Gibsonia, PA (US); Sergey B. Li, Glenshaw, PA (US); Laura Difalco, Pittsburgh, PA (US); Floryan Decampo, Pittsburgh, PA (US); Shilei Chen, Wheeling, IL (US)

(73) Assignee: Nissan Chemical Industries, Ltd., Tokyo (JP)

( * ) Notice: Subject to any disclaimer, the term of this patent is extended or adjusted under 35 U.S.C. 154(b) by 0 days.

(21) Appl. No.: 15/743,557

(22) PCT Filed: Jul. 6, 2016

(86) PCT No.: PCT/US2016/041046
§ 371 (c)(1),
(2) Date: Jan. 10, 2018

(87) PCT Pub. No.: WO2017/014945
PCT Pub. Date: Jan. 26, 2017

(65) Prior Publication Data
US 2018/0201799 A1  Jul. 19, 2018

Related U.S. Application Data

(60) Provisional application No. 62/193,973, filed on Jul. 17, 2015.

(51) Int. Cl.
| | | |
|---|---|---|
| *H01L 51/00* | (2006.01) | |
| *C09D 11/52* | (2014.01) | |
| *C09D 11/037* | (2014.01) | |
| *H01L 51/50* | (2006.01) | |
| *C09D 11/033* | (2014.01) | |
| *C09D 11/102* | (2014.01) | |
| *C09D 11/106* | (2014.01) | |
| *C08G 61/12* | (2006.01) | |
| *C08L 65/00* | (2006.01) | |
| *C08K 3/22* | (2006.01) | |
| *C09D 165/00* | (2006.01) | |

(52) U.S. Cl.
CPC ............ *C09D 11/52* (2013.01); *C08G 61/126* (2013.01); *C08L 65/00* (2013.01); *C09D 11/033* (2013.01); *C09D 11/037* (2013.01); *C09D 11/102* (2013.01); *C09D 11/106* (2013.01); *H01L 51/0003* (2013.01); *H01L 51/0036* (2013.01); *H01L 51/506* (2013.01); *C08G 2261/3223* (2013.01); *C08G 2261/512* (2013.01); *C08G 2261/91* (2013.01); *C08G 2261/92* (2013.01); *C08G 2261/94* (2013.01); *C08G 2261/95* (2013.01); *C08K 3/22* (2013.01); *C08K 2003/2241* (2013.01); *C08K 2003/2244* (2013.01); *C08K 2003/2255* (2013.01); *C08K 2003/2258* (2013.01); *C08K 2003/2296* (2013.01); *C08K 2201/011* (2013.01); *C09D 165/00* (2013.01); *H01L 51/5088* (2013.01); *H01L 2251/5369* (2013.01); *Y02E 10/549* (2013.01)

(58) Field of Classification Search
CPC ............ H01L 51/0003; H01L 51/0036; H01L 51/506; C09D 11/52; C09D 11/033; C09D 11/037; C09D 11/102; C09D 11/106
See application file for complete search history.

(56) References Cited

U.S. PATENT DOCUMENTS

| | | |
|---|---|---|
| 4,356,429 A | 10/1982 | Tang |
| 4,539,507 A | 9/1985 | Vanslyke et al. |
| 5,047,687 A | 9/1991 | Vanslyke et al. |
| 5,247,190 A | 9/1993 | Friend et al. |
| 5,401,827 A | 3/1995 | Holmes et al. |

(Continued)

FOREIGN PATENT DOCUMENTS

| | | |
|---|---|---|
| CN | 102842677 B | 6/2015 |
| EP | 2287939 A1 | 2/2011 |

(Continued)

OTHER PUBLICATIONS

International Search Report and Written Opinion in connection with international application No. PCT/US2016/041046; dated Oct. 20, 2016.

(Continued)

*Primary Examiner* — Victor A Mandala
*Assistant Examiner* — Colleen E Snow
(74) *Attorney, Agent, or Firm* — The Marbury Law Group, PLLC

(57) ABSTRACT

Described herein are non-aqueous ink compositions containing a polythiophene having a repeating unit complying with formula (I) described herein, one or more metallic nanoparticles, and a liquid carrier having one or more organic solvents. The present disclosure also concerns the uses of such non-aqueous ink compositions, for example, in organic electronic devices.

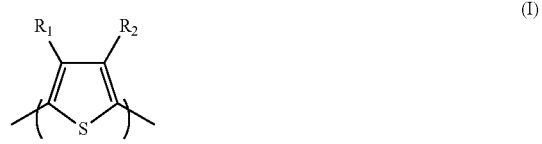

(I)

23 Claims, 16 Drawing Sheets

(56) References Cited

U.S. PATENT DOCUMENTS

| | | | |
|---|---|---|---|
| 5,454,880 | A | 10/1995 | Sariciftci et al. |
| 6,166,172 | A | 12/2000 | McCullough et al. |
| 6,602,974 | B1 | 8/2003 | McCullough et al. |
| 6,812,399 | B2 | 11/2004 | Shaheen et al. |
| 6,933,436 | B2 | 8/2005 | Shaheen et al. |
| 7,070,867 | B2 | 7/2006 | Thompson et al. |
| 8,674,047 | B2 | 3/2014 | Brown et al. |
| 8,865,025 | B2 | 10/2014 | Seshadri et al. |
| 2004/0113127 | A1 | 6/2004 | Min et al. |
| 2005/0123793 | A1 | 6/2005 | Thompson et al. |
| 2006/0175582 | A1 | 8/2006 | Hammond et al. |
| 2007/0077661 | A1 | 4/2007 | Lucht et al. |
| 2010/0108954 | A1 | 5/2010 | Benson-Smith et al. |
| 2010/0109000 | A1 | 5/2010 | Mathai et al. |
| 2010/0135854 | A1 | 6/2010 | Yang et al. |
| 2010/0292399 | A1 | 11/2010 | Brown et al. |
| 2011/0030789 | A1 | 2/2011 | Krebs |
| 2011/0248224 | A1 | 10/2011 | Lucht et al. |
| 2012/0175596 | A1 | 7/2012 | Faircloth et al. |
| 2013/0109813 | A1 | 5/2013 | Sheina et al. |
| 2015/0079715 | A1 | 3/2015 | Tregub et al. |

FOREIGN PATENT DOCUMENTS

| | | | |
|---|---|---|---|
| JP | 2014-067503 A | | 4/2014 |
| JP | 2015-504446 A | | 2/2015 |
| WO | WO 2011/030789 A1 | | 3/2011 |
| WO | WO 2011/052645 A1 | | 5/2011 |
| WO | WO 2013/178975 A1 | | 12/2013 |

OTHER PUBLICATIONS

Kraft et al., "Electroluminescent Conjugated Polymers-Seeing Polymers in a New Light," Angew. Chem. Int. Ed., (1998), 37, 402-428.

Lebedev et al., "Solvato-Controlled Doping of Conducting Polymers", Chem. Mater., (1998) vol. 10, pp. 156-163.

Office Action in connection to Japanese Patent Application No. 2018-502124, dated Nov. 20, 2018 (with English translation).

Office Action in connection to Japanese Patent Application No. 2018-502124, dated Jan. 29, 2019 (with English translation).

Extended European Search Report for European Application No. 16828210.1, dated Feb. 26, 2019.

Woo, Sungho, et al. "In-Situ Prepared Composite Materials of PEDOT: PSS Buffer Layer-Metal Nanoparticles and Their Application to Organic Solar Cells." Nanoscale Research Letters (2012) vol. 7, No. 1, pp. 641-646, Dec. 23, 2012. http://www.nanoscalereslett.com/content/7/1/641.

(b)

(c)

NQ ink 31

NQ ink 32

NQ ink 33

NQ ink 34

NQ ink 35

(c)

NQ ink 26

NQ ink 27

NQ ink 28

NQ ink 29

NQ ink 30

NON-AQUEOUS INK COMPOSITIONS CONTAINING METALLIC NANOPARTICLES SUITABLE FOR USE IN ORGANIC ELECTRONICS

CROSS REFERENCE TO RELATED APPLICATIONS

This application claims priority to U.S. Provisional Application No. 62/193,973, filed on Jul. 17, 2015, the entire content of which is explicitly incorporated herein by this reference.

FIELD OF THE INVENTION

The present disclosure relates to a non-aqueous ink composition comprising a polythiophene polymer and metallic nanoparticles, and uses thereof, for example, in organic electronic devices.

BACKGROUND

Although useful advances are being made in energy saving devices such as, for example, organic-based organic light emitting diodes (OLEDs), polymer light emitting diodes (PLEDs), phosphorescent organic light emitting diodes (PHOLEDs), and organic photovoltaic devices (OPVs), further improvements are still needed in providing better materials processing and/or device performance for commercialization. For example, one promising type of material used in organic electronics is the conducting polymers including, for example, polythiophenes. However, problems can arise with polymers' purity, processability, and instability in their neutral and/or conductive states. Also, it is important to have very good control over the solubility of polymers utilized in alternating layers of various devices' architectures (e.g., orthogonal or alternating solubility properties among adjacent layers in particular device architecture). These layers, for example, also known as hole injection layers (HILs) and hole transport layers (HTLs), can present difficult problems in view of competing demands and the need for very thin, but high quality, films.

In a typical OLED device stack, the refractive index for most p-doped polymeric HILs is around 1.5, such as HILs comprising PEDOT:PSS, while the emissive materials generally have a refractive index that is substantially higher (1.7 or higher). As a result, additional total internal reflection occurs at EML/HIL (or HTL/HIL) and HIL/ITO interfaces, leading to reduced light extraction efficiency.

There is an ongoing unresolved need for a good platform system to control properties of hole injection and transport layers, such as solubility, thermal/chemical stability, and electronic energy levels, such as HOMO and LUMO, so that the compounds can be adapted for different applications and to function with different compounds, such as light emitting layers, photoactive layers, and electrodes. Good solubility, intractability, and thermal stability properties are important. Also of importance is the ability to tune HIL resistivity and HIL layer thickness while retaining high transparency, low operating voltage, and/or high refractive index. The ability to formulate the system for a particular application and provide the required balance of such properties is also important.

SUMMARY OF THE INVENTION

In a first aspect, the present disclosure relates to a non-aqueous ink composition comprising:
(a) a polythiophene comprising a repeating unit complying with formula (I)

(I)

wherein $R_1$ and $R_2$ are each, independently, H, alkyl, fluoroalkyl, alkoxy, aryloxy, or —O—[Z—O]$_p$—R$_e$; wherein
  Z is an optionally halogenated hydrocarbylene group,
  p is equal to or greater than 1, and
  $R_e$ is H, alkyl, fluoroalkyl, or aryl;
(b) one or more metallic nanoparticles; and
(c) a liquid carrier comprising one or more organic solvents.

In a second aspect, the present disclosure relates to a process for forming a hole-carrying film, the process comprising:
1) coating a substrate with a non-aqueous ink composition described herein; and
2) annealing the coating on the substrate, thereby forming the hole-carrying film.

In a third aspect, the present disclosure relates to a hole-carrying film formed by the process described herein.

In a fourth aspect, the present disclosure relates to a device comprising the hole-carrying film described herein, wherein the device is an OLED, OPV, transistor, capacitor, sensor, transducer, drug release device, electrochromic device, or battery device.

An objective of the present invention is to provide the ability to tune electrical properties, such as resistivity, of HILs in a device comprising the compositions described herein.

Another objective of the present invention is to provide the ability to tune film thickness and retain high transparency or low absorbance in the visible spectrum (transmittance >90% T) in a device comprising the compositions described herein.

Still another objective of the present invention is to provide high refractive index while maintaining film thickness and high transparency or low absorbance in the visible spectrum (transmittance >90% T) in a device comprising the compositions described herein.

DETAILED DESCRIPTION

Figure 1A:
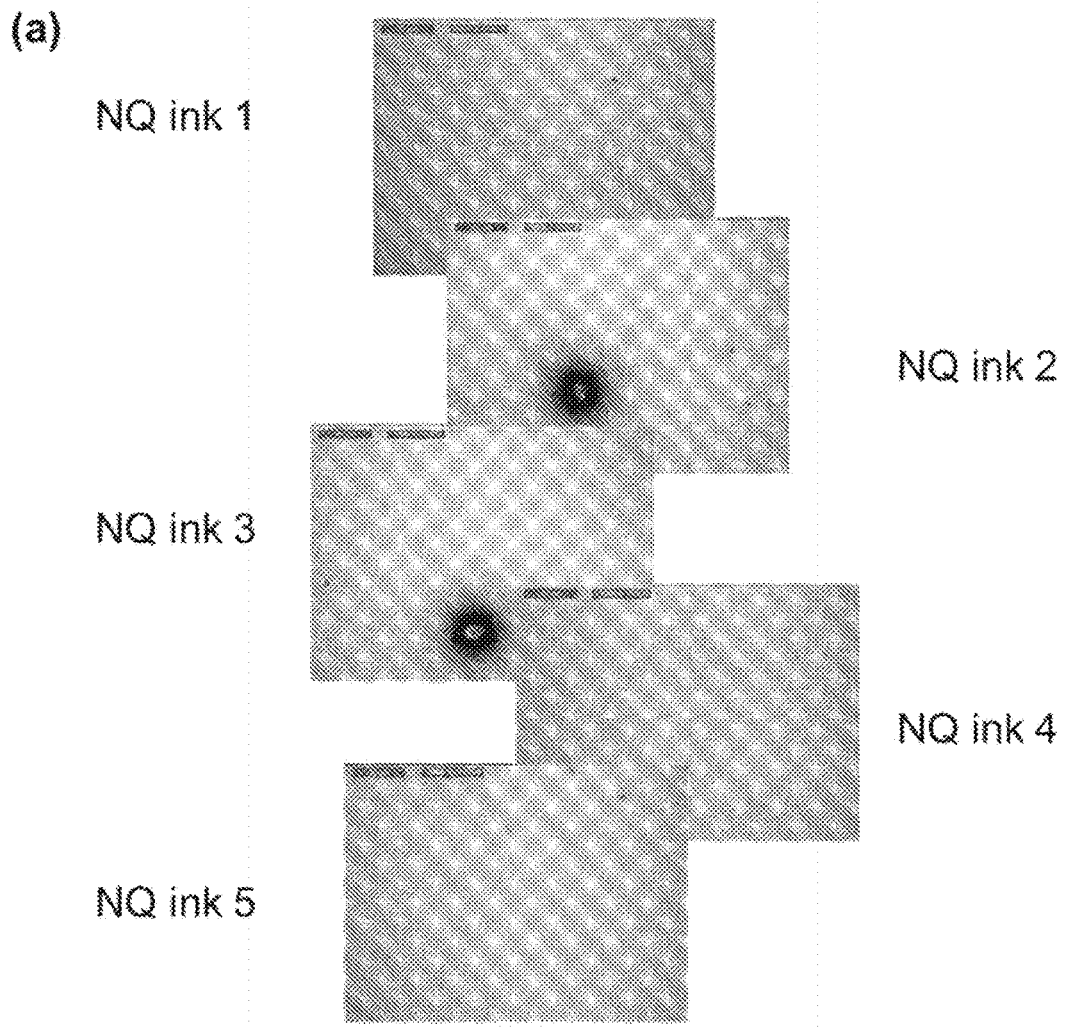
FIG. 1 shows images of the films formed from inventive NQ inks (a) 1-5, (b) 21-25, and (c) 31-35 under 1000× magnification.
Figure 1B:
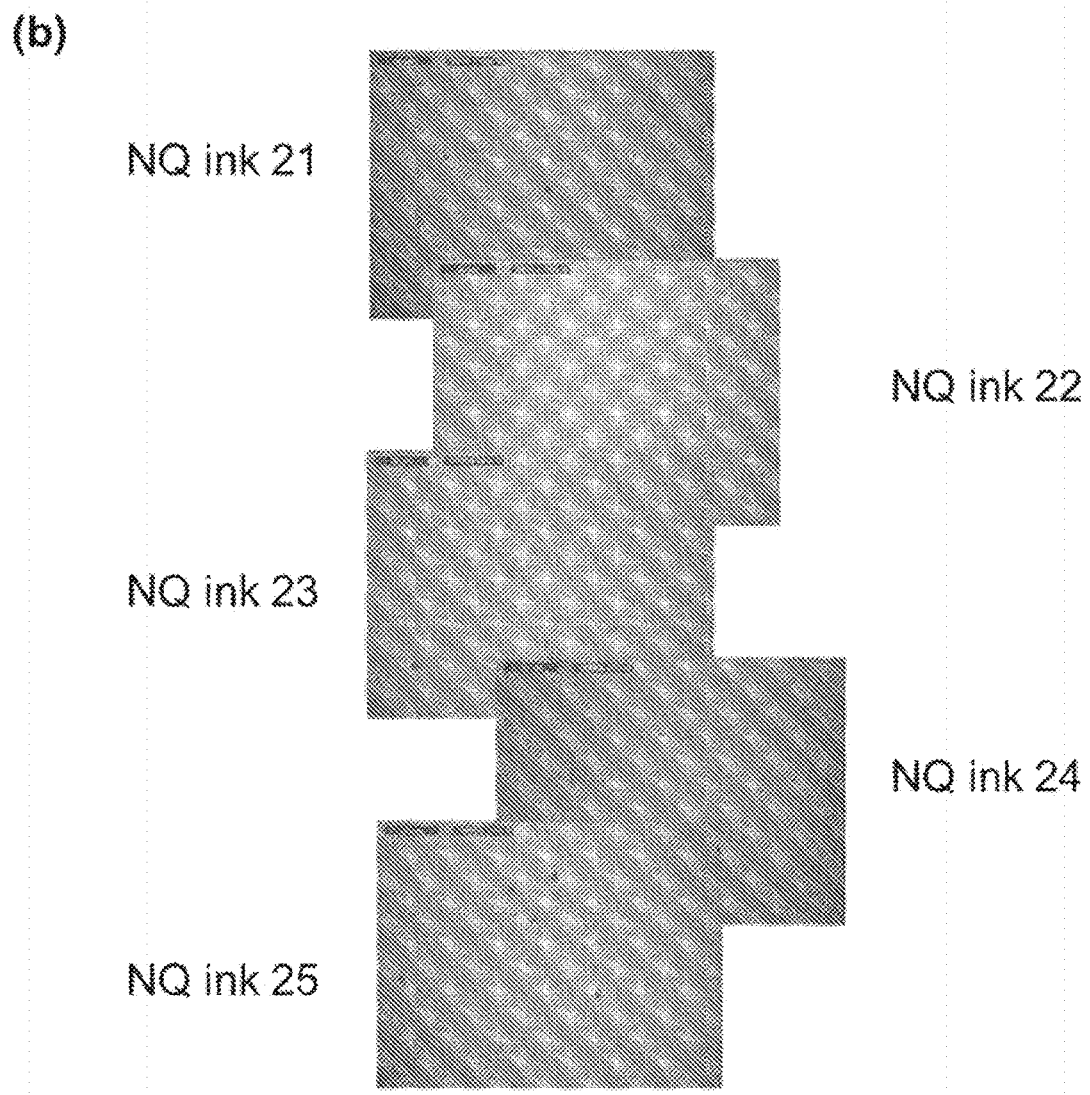
Figure 1C:
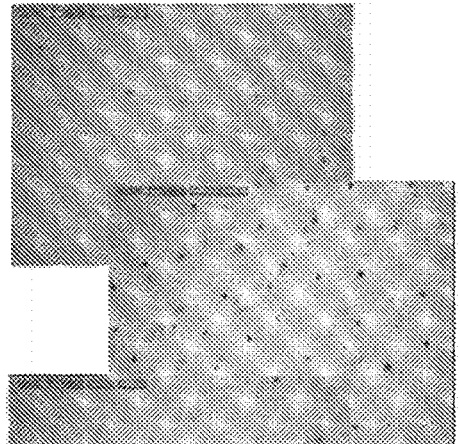
Figure 1C:
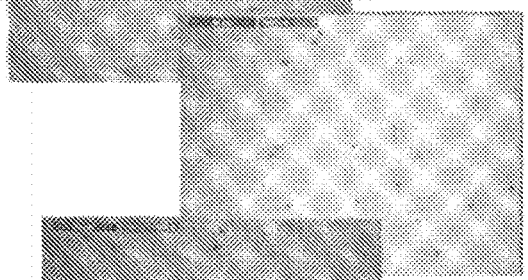
Figure 1C:
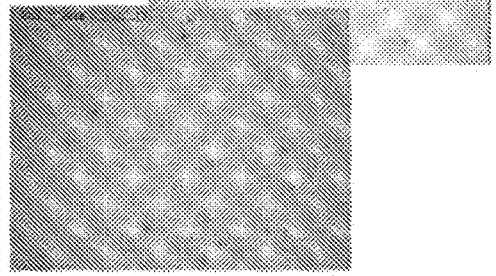
Figure 2A:
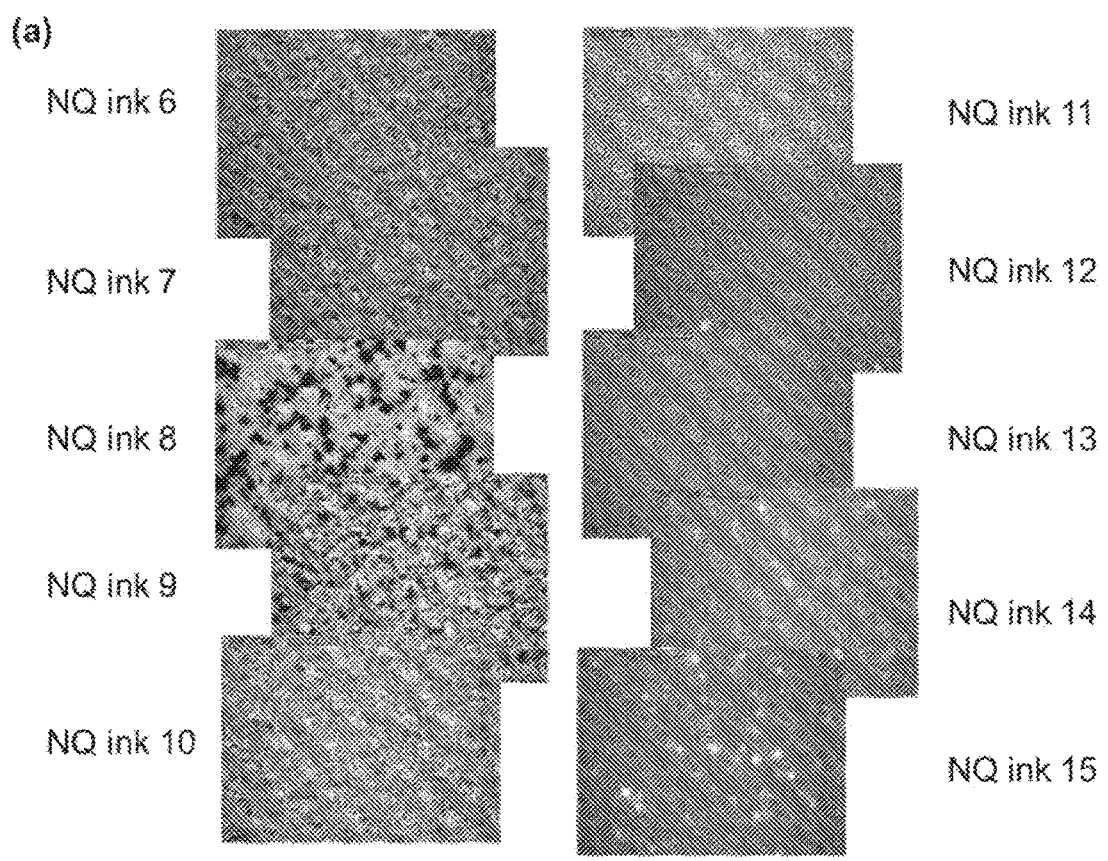
FIG. 2 shows images of the films formed from inventive NQ inks (a) 6-15, (b) 16-25, and (c) 26-30 under 1000× magnification.
Figure 2B:
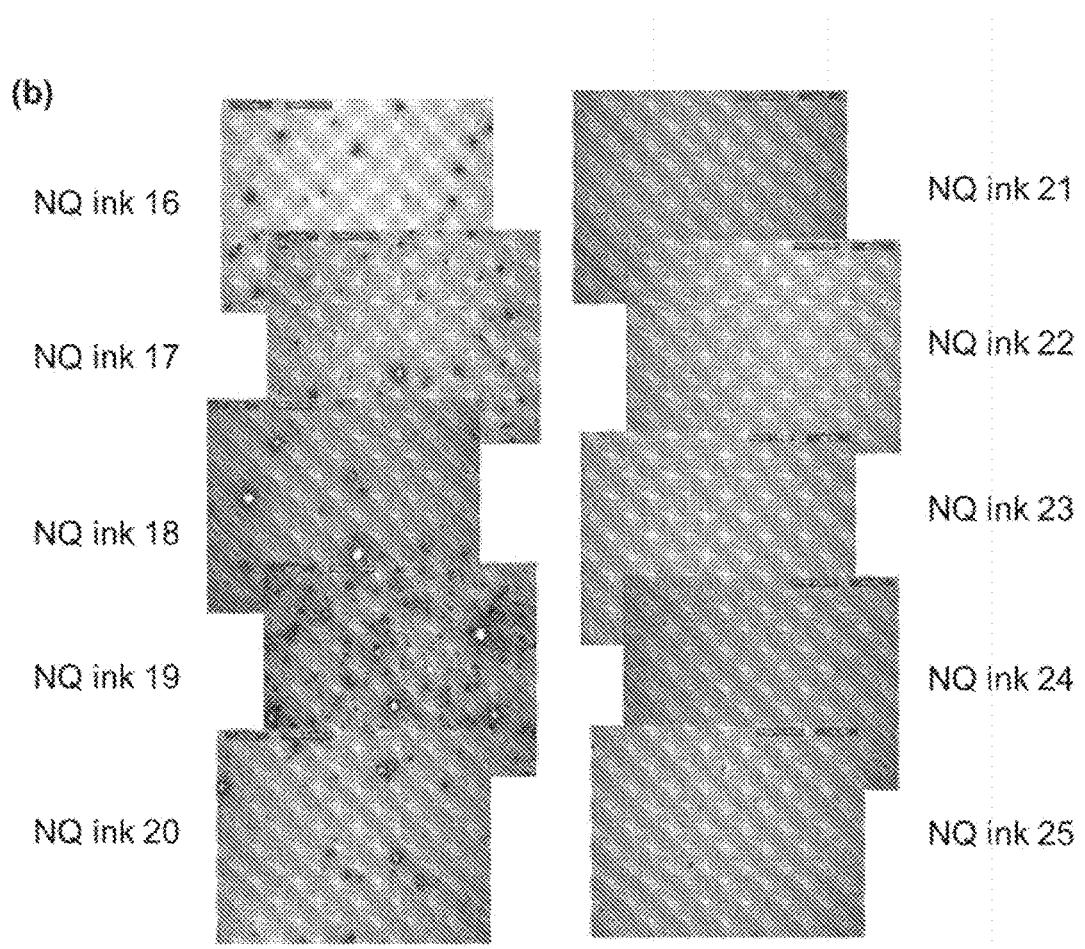
Figure 2C:
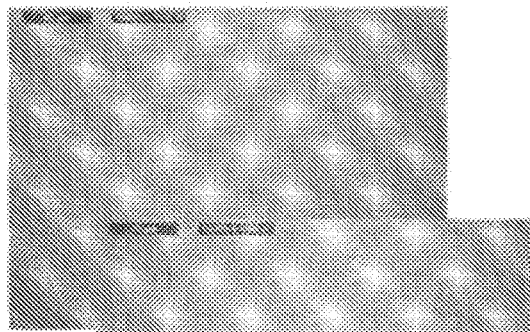
Figure 2C:
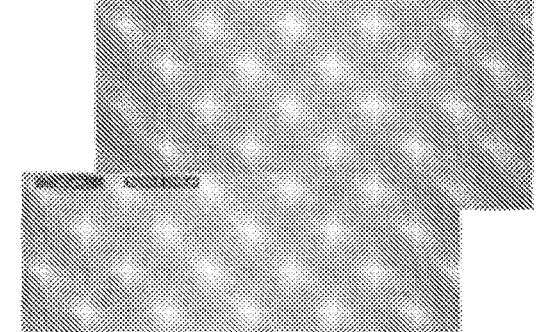
Figure 2C:
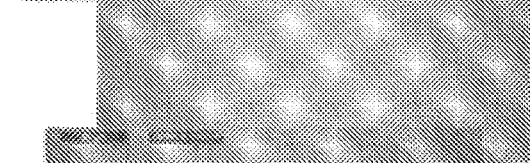
Figure 2C:
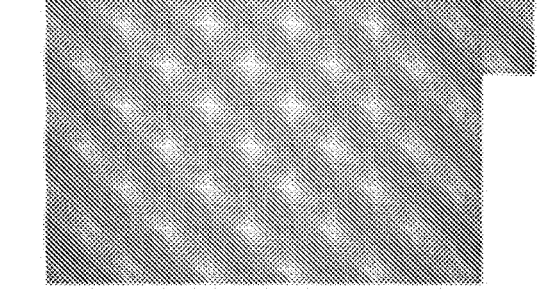

As used herein, the terms "a", "an", or "the" means "one or more" or "at least one" unless otherwise stated.

As used herein, the term "comprises" includes "consists essentially of" and "consists of." The term "comprising" includes "consisting essentially of" and "consisting of."

The phrase "free of" means that there is no external addition of the material modified by the phrase and that there is no detectable amount of the material that may be observed by analytical techniques known to the ordinarily-skilled artisan, such as, for example, gas or liquid chromatography, spectrophotometry, optical microscopy, and the like.

Throughout the present disclosure, various publications may be incorporated by reference. Should the meaning of any language in such publications incorporated by reference conflict with the meaning of the language of the present disclosure, the meaning of the language of the present disclosure shall take precedence, unless otherwise indicated.

As used herein, the terminology "(Cx-Cy)" in reference to an organic group, wherein x and y are each integers, means that the group may contain from x carbon atoms to y carbon atoms per group.

As used herein, the term "alkyl" means a monovalent straight or branched saturated hydrocarbon radical, more typically, a monovalent straight or branched saturated ($C_1$-$C_{40}$)hydrocarbon radical, such as, for example, methyl, ethyl, n-propyl, isopropyl, n-butyl, isobutyl, tert-butyl, hexyl, 2-ethylhexyl, octyl, hexadecyl, octadecyl, eicosyl, behenyl, tricontyl, and tetracontyl.

As used herein, the term "fluoroalkyl" means an alkyl radical as defined herein, more typically a ($C_1$-$C_{40}$) alkyl radical, that is substituted with one or more fluorine atoms. Examples of fluoroalkyl groups include, for example, difluoromethyl, trifluoromethyl, perfluoroalkyl, 1H,1H,2H, 2H-perfluorooctyl, perfluoroethyl, and —$CH_2CF_3$.

As used herein, the term "hydrocarbylene" means a divalent radical formed by removing two hydrogen atoms from a hydrocarbon, typically a ($C_1$-$C_{40}$) hydrocarbon. Hydrocarbylene groups may be straight, branched or cyclic, and may be saturated or unsaturated. Examples of hydrocarbylene groups include, but are not limited to, methylene, ethylene, 1-methylethylene, 1-phenylethylene, propylene, butylene, 1,2-benzene; 1,3-benzene; 1,4-benzene; and 2,6-naphthalene.

As used herein, the term "alkoxy" means a monovalent radical denoted as —O-alkyl, wherein the alkyl group is as defined herein. Examples of alkoxy groups, include, but are not limited to, methoxy, ethoxy, n-propoxy, isopropoxy, n-butoxy, isobutoxy, and tert-butoxy.

As used herein, the term "aryl" means a monovalent unsaturated hydrocarbon radical containing one or more six-membered carbon rings in which the unsaturation may be represented by three conjugated double bonds. Aryl radicals include monocyclic aryl and polycyclic aryl. Polycyclic aryl refers to a monovalent unsaturated hydrocarbon radical containing more than one six-membered carbon ring in which the unsaturation may be represented by three conjugated double bonds wherein adjacent rings may be linked to each other by one or more bonds or divalent bridging groups or may be fused together. Examples of aryl radicals include, but are not limited to, phenyl, anthracenyl, naphthyl, phenanthrenyl, fluorenyl, and pyrenyl.

As used herein, the term "aryloxy" means a monovalent radical denoted as —O-aryl, wherein the aryl group is as defined herein. Examples of aryloxy groups, include, but are not limited to, phenoxy, anthracenoxy, naphthoxy, phenanthrenoxy, and fluorenoxy.

Any substituent or radical described herein may optionally be substituted at one or more carbon atoms with one or more, same or different, substituents described herein. For instance, a hydrocarbylene group may be further substituted with an aryl group or an alkyl group. Any substituent or radical described herein may also optionally be substituted at one or more carbon atoms with one or more substituents selected from the group consisting of halogen, such as, for example, F, Cl, Br, and I; nitro ($NO_2$), cyano (CN), and hydroxy (OH).

As used herein, the term "hole carrier compound" refers to any compound that is capable of facilitating the movement of holes, i.e., positive charge carriers, and/or blocking the movement of electrons, for example, in an electronic device. Hole carrier compounds include compounds useful in layers (HTLs), hole injection layers (HILs) and electron blocking layers (EBLs) of electronic devices, typically organic electronic devices, such as, for example, organic light emitting devices.

As used herein, the term "doped" in reference to a hole carrier compound, for example, a polythiophene polymer, means that the hole carrier compound has undergone a chemical transformation, typically an oxidation or reduction reaction, more typically an oxidation reaction, facilitated by a dopant. As used herein, the term "dopant" refers to a substance that oxidizes or reduces, typically oxidizes, a hole carrier compound, for example, a polythiophene polymer. Herein, the process wherein a hole carrier compound undergoes a chemical transformation, typically an oxidation or reduction reaction, more typically an oxidation reaction, facilitated by a dopant is called a "doping reaction" or simply "doping". Doping alters the properties of the polythiophene polymer, which properties may include, but may not be limited to, electrical properties, such as resistivity and work function, mechanical properties, and optical properties. In the course of a doping reaction, the hole carrier compound becomes charged, and the dopant, as a result of the doping reaction, becomes the oppositely-charged counterion for the doped hole carrier compound. As used herein, a substance must chemically react, oxidize or reduce, typically oxidize, a hole carrier compound to be referred to as a dopant. Substances that do not react with the hole carrier compound but may act as counterions are not considered dopants according to the present disclosure. Accordingly, the term "undoped" in reference to a hole carrier compound, for example a polythiophene polymer, means that the hole carrier compound has not undergone a doping reaction as described herein.

The present disclosure relates to a non-aqueous ink composition comprising:
(a) a polythiophene comprising a repeating unit complying with formula (I)

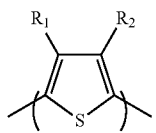

wherein $R_1$ and $R_2$ are each, independently, H, alkyl, fluoroalkyl, alkoxy, aryloxy, or $-O-[Z-O]_p-R_e$; wherein
Z is an optionally halogenated hydrocarbylene group,
p is equal to or greater than 1, and
$R_e$ is H, alkyl, fluoroalkyl, or aryl;
(b) one or more metallic nanoparticles; and
(c) a liquid carrier comprising one or more organic solvents.

The polythiophene suitable for use according to the present disclosure comprises a repeating unit complying with formula (I)

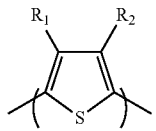

wherein $R_1$ and $R_2$ are each, independently, H, alkyl, fluoroalkyl, alkoxy, aryloxy, or $-O-[Z-O]_p-R_e$; wherein Z is an optionally halogenated hydrocarbylene group, p is equal to or greater than 1, and $R_e$ is H, alkyl, fluoroalkyl, or aryl.

In an embodiment, $R_1$ and $R_2$ are each, independently, H, fluoroalkyl, $-O[C(R_aR_b)-C(R_cR_d)-O]_p-R_e$, $-OR_f$; wherein each occurrence of $R_a$, $R_b$, $R_c$, and $R_d$, are each, independently, H, halogen, alkyl, fluoroalkyl, or aryl; $R_e$ is H, alkyl, fluoroalkyl, or aryl; p is 1, 2, or 3; and $R_f$ is alkyl, fluoroalkyl, or aryl.

In an embodiment, $R_1$ is H and $R_2$ is other than H. In such an embodiment, the repeating unit is derived from a 3-substituted thiophene.

The polythiophene can be a regiorandom or a regioregular compound. Due to its asymmetrical structure, the polymerization of 3-substituted thiophenes produces a mixture of polythiophene structures containing three possible regiochemical linkages between repeat units. The three orientations available when two thiophene rings are joined are the 2,2'; 2,5', and 5,5' couplings. The 2,2' (or head-to-head) coupling and the 5,5' (or tail-to-tail) coupling are referred to as regiorandom couplings. In contrast, the 2,5' (or head-to-tail) coupling is referred to as a regioregular coupling. The degree of regioregularity can be, for example, about 0 to 100%, or about 25 to 99.9%, or about 50 to 98%. Regio-regularity may be determined by standard methods known to those of ordinary skill in the art, such as, for example, using NMR spectroscopy.

In an embodiment, the polythiophene is regioregular. In some embodiments, the regioregularity of the polythiophene can be at least about 85%, typically at least about 95%, more typically at least about 98%. In some embodiments, the degree of regioregularity can be at least about 70%, typically at least about 80%. In yet other embodiments, the regioregular polythiophene has a degree of regioregularity of at least about 90%, typically a degree of regioregularity of at least about 98%.

3-substituted thiophene monomers, including polymers derived from such monomers, are commercially-available or may be made by methods known to those of ordinary skill in the art. Synthetic methods, doping, and polymer characterization, including regioregular polythiophenes with side groups, is provided in, for example, U.S. Pat. No. 6,602,974 to McCullough et al. and U.S. Pat. No. 6,166,172 to McCullough et al.

In another embodiment, $R_1$ and $R_2$ are both other than H. In such an embodiment, the repeating unit is derived from a 3,4-disubstituted thiophene.

In an embodiment, $R_1$ and $R_2$ are each, independently, $-O[C(R_aR_b)-C(R_cR_d)-O]_p-R_e$, or $-OR_f$. In an embodiment, $R_1$ and $R_2$ are both $-O[C(R_aR_b)-C(R_cR_d)-O]_p-R_e$. $R_1$ and $R_2$ may be the same or different.

In an embodiment, each occurrence of $R_a$, $R_b$, $R_c$, and $R_d$, are each, independently, H, $(C_1-C_8)$alkyl, $(C_1-C_8)$fluoroalkyl, or phenyl; and $R_e$ is $(C_1-C_8)$alkyl, $(C_1-C_8)$fluoroalkyl, or phenyl.

In an embodiment, $R_1$ and $R_2$ are each $-O[CH_2-CH_2-O]_p-R_e$. In an embodiment, $R_1$ and $R_2$ are each $-O[CH(CH_3)-CH_2-O]_p-R_e$.

In an embodiment, $R_e$ is methyl, propyl, or butyl.

In an embodiment, the polythiophene comprises a repeating unit selected from the group consisting of

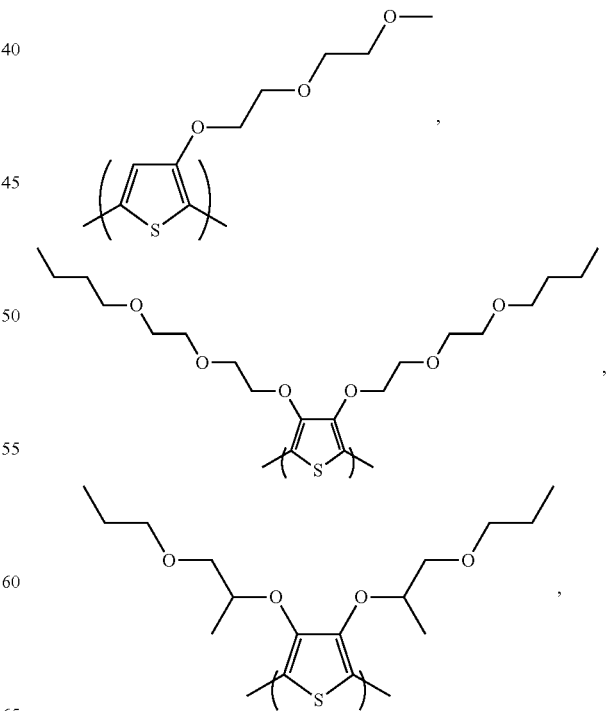

and combinations thereof.

It would be understood by the ordinarily-skilled artisan that the repeating unit

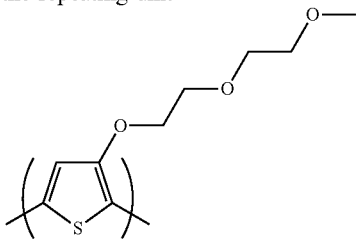

is derived from a monomer represented by the structure

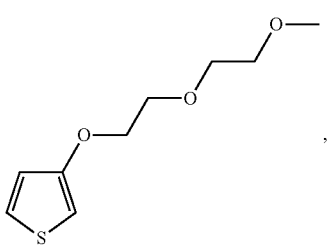

3-(2-(2-methoxyethoxy)ethoxy)thiophene [referred to herein as 3-MEET]; the repeating unit

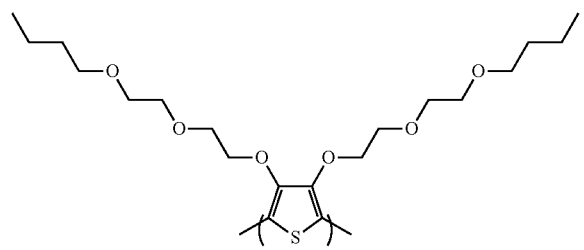

is derived from a monomer represented by the structure

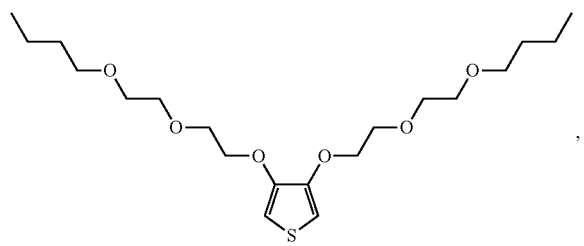 [SMILES: CCCCOCCOCCOc1cscc1OCCOCCOCCCC]

3,4-bis(2-(2-butoxyethoxy)ethoxy)thiophene [referred to herein as 3,4-diBEET]; and the repeating unit

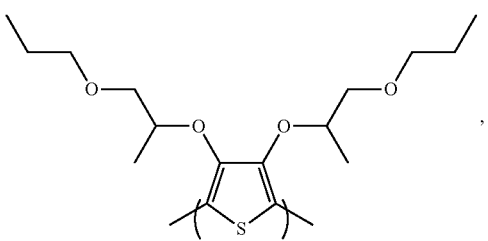

is derived from a monomer represented by the structure

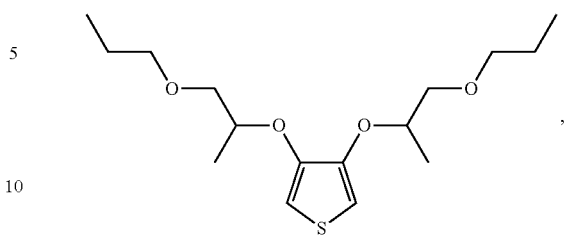

3,4-bis((1-propoxypropan-2-yl)oxy)thiophene [referred to herein as 3,4-diPPT].

3,4-disubstituted thiophene monomers, including polymers derived from such monomers, are commercially-available or may be made by methods known to those of ordinary skill in the art. For example, a 3,4-disubstituted thiophene monomer may be produced by reacting 3,4-dibromothiophene with the metal salt, typically sodium salt, of a compound given by the formula HO—[Z—O]$_p$—R$_e$ or HOR$_f$, wherein Z, R$_e$, R$_f$ and p are as defined herein.

The polymerization of 3,4-disubstituted thiophene monomers may be carried out by, first, brominating the 2 and 5 positions of the 3,4-disubstituted thiophene monomer to form the corresponding 2,5-dibromo derivative of the 3,4-disubstituted thiophene monomer. The polymer can then be obtained by GRIM (Grignard methathesis) polymerization of the 2,5-dibromo derivative of the 3,4-disubstituted thiophene in the presence of a nickel catalyst. Such a method is described, for example, in U.S. Pat. No. 8,865,025, the entirety of which is hereby incorporated by reference. Another known method of polymerizing thiophene monomers is by oxidative polymerization using organic non-metal containing oxidants, such as 2,3-dichloro-5,6-dicyano-1,4-benzoquinone (DDQ), or using a transition metal halide, such as, for example, iron(III) chloride, molybdenum(V) chloride, and ruthenium(III) chloride, as oxidizing agent.

Examples of compounds having the formula HO—[Z—O]$_p$—R$_e$ or HOR$_f$ that may be converted to the metal salt, typically sodium salt, and used to produce 3,4-disubstituted thiophene monomers include, but are not limited to, trifluoroethanol, ethylene glycol monohexyl ether (hexyl Cellosolve), propylene glycol monobutyl ether (Dowanol PnB), diethylene glycol monoethyl ether (ethyl Carbitol), dipropylene glycol n-butyl ether (Dowanol DPnB), diethylene glycol monophenyl ether (phenyl Carbitol), ethylene glycol monobutyl ether (butyl Cellosolve), diethylene glycol monobutyl ether (butyl Carbitol), dipropylene glycol monomethyl ether (Dowanol DPM), diisobutyl carbinol, 2-ethylhexyl alcohol, methyl isobutyl carbinol, ethylene glycol monophenyl ether (Dowanol Eph), propylene glycol monopropyl ether (Dowanol PnP), propylene glycol monophenyl ether (Dowanol PPh), diethylene glycol monopropyl ether (propyl Carbitol), diethylene glycol monohexyl ether (hexyl Carbitol), 2-ethylhexyl carbitol, dipropylene glycol monopropyl ether (Dowanol DPnP), tripropylene glycol monomethyl ether (Dowanol TPM), diethylene glycol monomethyl ether (methyl Carbitol), and tripropylene glycol monobutyl ether (Dowanol TPnB).

The polythiophene having a repeating unit complying with formula (I) of the present disclosure may be further modified subsequent to its formation by polymerization. For instance, polythiophenes having one or more repeating units derived from 3-substituted thiophene monomers may possess one or more sites where hydrogen may be replaced by a substituent, such as a sulfonic acid group (—SO$_3$H) by sulfonation.

In an embodiment, the polythiophene is sulfonated.

As used herein, the term "sulfonated" in relation to the polythiophene polymer means that the polythiophene comprises one or more sulfonic acid groups (—SO$_3$H). Typically, the sulfur atom of the —SO$_3$H group is directly bonded to the backbone of the polythiophene polymer and not to a side group. For the purpose of the present disclosure, a side group is a monovalent radical that when theoretically or actually removed from the polymer does not shorten the length of the polymer chain. The sulfonated polythiophene polymer and/or copolymer may be made using any method known to those of ordinary skill in the art. For example, the polythiophene may be sulfonated by reacting the polythiophene with a sulfonating reagent such as, for example, fuming sulfuric acid, acetyl sulfate, pyridine SO$_3$, or the like. In another example, monomers may be sulfonated using a sulfonating reagent and then polymerized according to known methods and/or methods described herein.

The sulfonation of conjugated polymers and sulfonated conjugated polymers, including sulfonated polythiophenes, are described in U.S. Pat. No. 8,017,241 to Seshadri et al., which is incorporated herein by reference in its entirety.

In an embodiment, however, the polythiophene of the ink composition described herein is free of sulfonic acid groups.

The polythiophene polymers used according to the present disclosure may be homopolymers or copolymers, including statistical, random, gradient, and block copolymers. For a polymer comprising a monomer A and a monomer B, block copolymers include, for example, A-B diblock copolymers, A-B-A triblock copolymers, and -(AB)$_n$-multiblock copolymers. The polythiophene may comprise repeating units derived from other types of monomers such as, for example, thienothiophenes, selenophenes, pyrroles, furans, tellurophenes, anilines, arylamines, and arylenes, such as, for example, phenylenes, phenylene vinylenes, and fluorenes.

In an embodiment, the polythiophene comprises repeating units complying with formula (I) in an amount of greater than 70% by weight, typically greater than 80% by weight, more typically greater than 90% by weight, even more typically greater than 95% by weight, based on the total weight of the repeating units.

It would be clear to a person of ordinary skill in the art that, depending on the purity of the starting monomer compound(s) used in the polymerization, the polymer formed may contain repeating units derived from impurities. As used herein, the term "homopolymer" is intended to mean a polymer comprising repeating units derived from one type of monomer, but may contain repeating units derived from impurities. In an embodiment, the polythiophene is a homopolymer wherein essentially all of the repeating units are repeating units complying with formula (I).

The polythiophene polymer typically has a number average molecular weight between about 1,000 and 1,000,000 g/mol. More typically, the conjugated polymer has a number average molecular weight between about 5,000 and 100,000 g/mol, even more typically about 10,000 to about 50,000 g/mol. Number average molecular weight may be determined according to methods known to those of ordinary skill in the art, such as, for example, by gel permeation chromatography.

The non-aqueous ink composition of the present disclosure may optionally further comprise other hole carrier compounds.

Optional hole carrier compounds include, for example, low molecular weight compounds or high molecular weight compounds. The optional hole carrier compounds may be non-polymeric or polymeric. Non-polymeric hole carrier compounds include, but are not limited to, cross-linkable and non-crosslinked small molecules. Examples of non-polymeric hole carrier compounds include, but are not limited to, N,N'-bis(3-methylphenyl)-N,N'-bis(phenyl)benzidine (CAS #65181-78-4); N,N'-bis(4-methylphenyl)-N,N'-bis(phenyl)benzidine; N,N'-bis(2-naphtalenyl)-N—N'-bis(phenylbenzidine) (CAS #139255-17-1); 1,3,5-tris(3-methyldiphenylamino)benzene (also referred to as m-MTDAB); N,N'-bis(1-naphtalenyl)-N,N'-bis(phenyl)benzidine (CAS #123847-85-8, NPB); 4,4',4"-tris(N,N-phenyl-3-methylphenylamino)triphenylamine (also referred to as m-MTDATA, CAS #124729-98-2); 4,4',N,N'-diphenylcarbazole (also referred to as CBP, CAS #58328-31-7); 1,3,5-tris(diphenylamino)benzene; 1,3,5-tris(2-(9-ethylcarbazyl-3)ethylene)benzene; 1,3,5-tris[(3-methylphenyl)phenylamino]benzene; 1,3-bis(N-carbazolyl)benzene; 1,4-bis(diphenylamino)benzene; 4,4'-bis(N-carbazolyl)-1,1'-biphenyl; 4,4'-bis(N-carbazolyl)-1,1'-biphenyl; 4-(dibenzylamino)benzaldehyde-N, N-diphenylhydrazone; 4-(diethylamino)benzaldehyde diphenylhydrazone; 4-(dimethylamino)benzaldehyde diphenylhydrazone; 4-(diphenylamino)benzaldehyde diphenylhydrazone; 9-ethyl-3-carbazolecarboxaldehyde diphenylhydrazone; copper(II) phthalocyanine; N,N'-bis(3-methylphenyl)-N,N'-diphenylbenzidine; N,N'-di-[(1-naphthyl)-N,N'-diphenyl]-1,1'-biphenyl)-4,4'-diamine; N,N'-diphenyl-N,N'-di-p-tolylbenzene-1,4-diamine; tetra-N-phenylbenzidine; titanyl phthalocyanine; tri-p-tolylamine; tris(4-carbazol-9-ylphenyl)amine; and tris[4-(diethylamino)phenyl]amine.

Optional polymeric hole carrier compounds include, but are not limited to, poly[(9,9-dihexylfluorenyl-2,7-diyl)-alt-co-(N,N'bis{p-butylphenyl}-1,4-diaminophenylene)]; poly[(9,9-dioctylfluorenyl-2,7-diyl)-alt-co-(N,N'-bis{p-butylphenyl}-1,1'-biphenylene-4,4'-diamine)]; poly(9,9-dioctylfluorene-co-N-(4-butylphenyl)diphenylamine) (also referred to as TFB) and poly[N,N'-bis(4-butylphenyl)-N,N'-bis(phenyl)-benzidine] (commonly referred to as poly-TPD).

Other optional hole carrier compounds are described in, for example, US Patent Publications 2010/0292399 published Nov. 18, 2010; 2010/010900 published May 6, 2010; and 2010/0108954 published May 6, 2010. Optional hole carrier compounds described herein are known in the art and are commercially available.

The polythiophene comprising a repeating unit complying with formula (I) may be doped or undoped.

In an embodiment, the polythiophene comprising a repeating unit complying with formula (I) is doped with a dopant. Dopants are known in the art. See, for example, U.S. Pat. No. 7,070,867; US Publication 2005/0123793; and US Publication 2004/0113127. The dopant can be an ionic compound. The dopant can comprise a cation and an anion. One or more dopants may be used to dope the polythiophene comprising a repeating unit complying with formula (I).

The cation of the ionic compound can be, for example, V, Cr, Mn, Fe, Co, Ni, Cu, Nb, Mo, Tc, Ru, Rh, Pd, Ag, Ta, W, Re, Os, Ir, Pt, or Au.

The cation of the ionic compound can be, for example, gold, molybdenum, rhenium, iron, and silver cation.

In some embodiments, the dopant can comprise a sulfonate or a carboxylate, including alkyl, aryl, and heteroaryl sulfonates and carboxylates. As used herein, "sulfonate" refers to a —$SO_3M$ group, wherein M may be $H^+$ or an alkali metal ion, such as, for example, $Na^+$, $Li^+$, $K^+$, $R_b^+$, $Cs^+$; or ammonium ($NH_4^+$). As used herein, "carboxylate" refers to a —$CO_2M$ group, wherein M may be $H^+$ or an alkali metal ion, such as, for example, $Na^+$, $Li^+$, $K^+$, $R_b^+$, $Cs^+$; or ammonium ($NH_4^+$). Examples of sulfonate and carboxylate dopants include, but are not limited to, benzoate compounds, heptafluorobutyrate, methanesulfonate, trifluoromethanesulfonate, p-toluenesulfonate, pentafluoropropionate, and polymeric sulfonates, perfluorosufonate-containing ionomers, and the like.

In some embodiments, the dopant does not comprise a sulfonate or a carboxylate.

In some embodiments, dopants may comprise sulfonylimides, such as, for example, bis(trifluoromethanesulfonyl)imide; antimonates, such as, for example, hexafluoroantimonate; arsenates, such as, for example, hexafluoroarsenate; phosphorus compounds, such as, for example, hexafluorophosphate; and borates, such as, for example, tetrafluoroborate, tetraarylborates, and trifluoroborates. Examples of tetraarylborates include, but are not limited to, halogenatedtetraarylborates, such as tetrakispentafluorophenylborate (TPFB). Examples of trifluoroborates include, but are not limited to, (2-nitrophenyl)trifluoroborate, benzofurazan-5-trifluoroborate, pyrimidine-5-trifluoroborate, pyridine-3-trifluoroborate, and 2,5-dimethylthiophene-3-trifluoroborate.

In an embodiment, the dopant comprises a tetraarylborate.

In one embodiment the dopant may be a silver salt comprising a tetraarylborate, typically a halogenated tetraarylborate.

In an embodiment, the dopant comprises tetrakis(pentafluorophenyl)borate (TPFB).

In an embodiment, the dopant is silver tetrakis(pentafluorophenyl)borate, represented by the structure

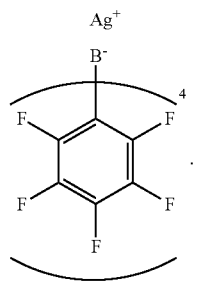

The dopant may be obtained commercially or synthesized using techniques known to those of ordinary skill in the art. For example, a silver salt comprising a tetraarylborate, such as AgTPFB, may be obtained, for example, via a metathesis reaction carried out with a water soluble silver salt and a tetraarylborate salt. For example, the reaction can be represented by:

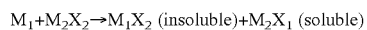

The precipitation of $M_1X_2$ can facilitate, for at least some cases, driving the reaction to the right to produce relatively high yields. $M_1$ can be a metal, such as, for example, silver, and $M_2$ can be a metal, such as, for example, lithium. $X_1$ can provide water solubility, such as, for example, nitrate. $X_2$ can be a non-coordinating anion, such as tetraarylborate. $M_1X_2$ can be insoluble in water, and $M_2X_1$ can be soluble in water.

For example, AgTPFB can be prepared by a metathesis of lithium tetrakis(pentafluorophenyl)borate (LiTPFB) and silver nitrate by dissolving in acetonitrile followed by precipitation in water. Such a method is described, for example, in U.S. Pat. No. 8,674,047, the entirety of which is hereby incorporated by reference.

As disclosed herein, the polythiophene can be doped with a dopant. A dopant can be, for example, a material that will undergo one or more electron transfer reaction(s) with, for example, a conjugated polymer, thereby yielding a doped polythiophene.

The dopant can be selected to provide a suitable charge balancing counter-anion. A reaction can occur upon mixing of the polythiophene and the dopant as known in the art. For example, the dopant may undergo spontaneous electron transfer from the polymer to a cation-anion dopant, such as a metal salt, leaving behind a conjugated polymer in its oxidized form with an associated anion and free metal. See, for example, Lebedev et al., Chem. Mater., 1998, 10, 156-163. As disclosed herein, the polythiophene and the dopant can refer to components that will react to form a doped polymer. The doping reaction can be a charge transfer reaction, wherein charge carriers are generated, and the reaction can be reversible or irreversible. In some embodiments, silver ions may undergo electron transfer to or from silver metal and the doped polymer.

In the final formulation, the composition can be distinctly different from the combination of original components (i.e., polythiophene and/or dopant may or may not be present in the final composition in the same form before mixing).

Some embodiments allow for removal of reaction by-products from the doping process. For example, the metals, such as silver, can be removed by filtrations.

Materials can be purified to remove, for example, halogens and metals. Halogens include, for example, chloride, bromide and iodide. Metals include, for example, the cation of the dopant, including the reduced form of the cation of the dopant, or metals left from catalyst or initiator residues. Metals include, for example, silver, nickel, and magnesium. The amounts can be less than, for example, 100 ppm, or less than 10 ppm, or less than 1 ppm.

Metal content, including silver content, can be measured by ICP-MS, particularly for concentrations greater than 50 ppm.

In an embodiment, when the polythiophene is doped with a dopant, the polythiophene and the dopant are mixed to form a doped polymer composition. Mixing may be achieved using any method known to those of ordinary skill in the art. For example, a solution comprising the polythiophene may be mixed with a separate solution comprising the dopant. The solvent or solvents used to dissolve the polythiophene and the dopant may be one or more solvents described herein. A reaction can occur upon mixing of the polythiophene and the dopant as known in the art. The resulting doped polythiophene composition comprises between about 40% and 75% by weight of the polymer and between about 25% and 55% by weight of the dopant, based on the composition. In another embodiment, the doped polythiophene composition comprises between about 50% and 65% for the polythiophene and between about 35% and 50% of the dopant, based on the composition. Typically, the amount by weight of the polythiophene is greater than the amount by weight of the dopant. Typically, the dopant can be a silver salt, such as silver tetrakis(pentafluorophenyl)

borate in an amount of about 0.25 to 0.5 m/ru, wherein m is the molar amount of silver salt and ru is the molar amount of polymer repeat unit.

The doped polythiophene is isolated according to methods known to those of ordinary skill in the art, such as, for example, by rotary evaporation of the solvent, to obtain a dry or substantially dry material, such as a powder. The amount of residual solvent can be, for example, 10 wt. % or less, or 5 wt. % or less, or 1 wt. % or less, based on the dry or substantially dry material. The dry or substantially dry powder can be redispersed or redissolved in one or more new solvents.

The non-aqueous ink compositions of the present disclosure comprise one or more metallic nanoparticles.

As used herein, the term "nanoparticle" refers to a nanoscale particle, the number average diameter of which is typically less than or equal to 500 nm. The number average diameter may be determined using techniques and instrumentation known to those of ordinary skill in the art. For instance, transmission electron microscopy (TEM) may be used.

TEM may be used to characterize size and size distribution, among other properties, of the metallic nanoparticles. Generally, TEM works by passing an electron beam through a thin sample to form an image of the area covered by the electron beam with magnification high enough to observe the lattice structure of a crystal. The measurement sample is prepared by evaporating a dispersion having a suitable concentration of nanoparticles on a specially-made mesh grid. The crystal quality of the nanoparticles can be measured by the electron diffraction pattern and the size and shape of the nanoparticles can be observed in the resulting micrograph image. Typically, the number of nanoparticles and projected two-dimensional area of every nanoparticle in the field-of-view of the image, or fields-of-view of multiple images of the same sample at different locations, are determined using image processing software, such as ImageJ (available from US National Institutes of Health). The projected two-dimensional area, A, of each nanoparticle measured is used to calculate its circular equivalent diameter, or area-equivalent diameter, $x_A$, which is defined as the diameter of a circle with the same area as the nanoparticle. The circular equivalent diameter is simply given by the equation $$x_A = \sqrt{\frac{4A}{\pi}}$$

The arithmetic average of the circular equivalent diameters of all of the nanoparticles in the observed image is then calculated to arrive at the number average particle diameter, as used herein. A variety of TEM microscopes available, for instance, Jeol JEM-2100F Field Emission TEM and Jeol JEM 2100 LaB6 TEM (available from JEOL USA). It is understood that all TE microscopes function on similar principles and when operated according to standard procedures, the results are interchangeable.

The number average particle diameter of the metallic nanoparticles described herein is less than or equal to 500 nm; less than or equal to 250 nm; less than or equal to 100 nm; or less than or equal to 50 nm; or less than or equal to 25 nm. Typically, the metallic nanoparticles have number average particle diameter from about 1 nm to about 100 nm, more typically from about 2 nm to about 30 nm, even more typically from about 7 nm to about 10 nm.

The shape or geometry of metallic nanoparticles of the present disclosure can be characterized by number average aspect ratio. As used herein, the terminology "aspect ratio" means the ratio of the Feret's minimum length to the Feret's maximum length, or $$\frac{x_{Fmin}}{x_{Fmax}}.$$

As used herein, the maximum Feret's diameter, $x_{Fmax}$, is defined as the furthest distance between any two parallel tangents on the two-dimensional projection of a particle in a TEM micrograph. Likewise, the minimum Feret's diameter, $x_{Fmin}$, is defined as the shortest distance between any two parallel tangents on the two-dimensional projection of a particle in a TEM micrograph. The aspect ratio of each particle in the field-of-view of a micrograph is calculated and the arithmetic average of the aspect ratios of all of the particles in the image is calculated to arrive at the number average aspect ratio. Generally, the number average aspect ratio of the metallic nanoparticles described herein is from about 0.9 to about 1.1, typically about 1.

The metallic nanoparticles suitable for use according to the present disclosure may comprise a metal, mixed metal, alloy, metal oxide, or mixed metal oxide, such as indium tin oxide (ITO). Metals include, for example, main group metals such as, for example, lead, tin, bismuth, and indium, and transition metals, for example, a transition metal selected from the group consisting of gold, silver, copper, nickel, cobalt, palladium, platinum, iridium, osmium, rhodium, ruthenium, rhenium, vanadium, chromium, manganese, niobium, molybdenum, tungsten, tantalum, titanium, zirconium, zinc, mercury, yttrium, iron and cadmium. Some non-limiting, specific examples of suitable metallic nanoparticles include, but are not limited to, nanoparticles comprising a transition metal oxide, such as zirconium oxide ($ZrO_2$), titanium dioxide ($TiO_2$), zinc oxide (ZnO), vanadium(V) oxide ($V_2O_5$), molybdenum trioxide ($MoO_3$), and tungsten trioxide ($WO_3$), In an embodiment, the non-aqueous ink composition of the present disclosure comprises one or more metallic nanoparticles comprising a transition metal oxide.

In an embodiment, the non-aqueous ink composition of the present disclosure comprises one or more metallic nanoparticles comprising zirconium oxide ($ZrO_2$), titanium dioxide ($TiO_2$), zinc oxide (ZnO), vanadium(V) oxide ($V_2O_5$), molybdenum trioxide ($MoO_3$), tungsten trioxide ($WO_3$), or mixtures thereof.

In an embodiment, the non-aqueous ink composition of the present disclosure comprises one or more metallic nanoparticles comprising $ZrO_2$.

The metallic nanoparticles may comprise one or more organic capping groups. Such organic capping groups may be reactive or non-reactive. Reactive organic capping groups are organic capping groups capable of cross-linking, for example, in the presence of UV radiation or radical initiators.

In an embodiment, the metallic nanoparticles comprise one or more organic capping groups.

Examples of suitable metallic nanoparticles include, but are not limited to, metallic nanoparticles described in US Publication No. 2013/0207053. Further examples of suitable metallic nanoparticles include $ZrO_2$ nanoparticles available as dispersions in propylene glycol methyl ether acetate solvent, marketed as PixClear™ by Pixelligent. The amount of the metallic nanoparticles used in the non-aqueous ink composition described herein can be controlled and measured as a weight percentage relative to the combined weight of the metallic nanoparticles and the doped or undoped polythiophene. In an embodiment, the amount of the metallic nanoparticles is from 1 wt. % to 90 wt. %, typically from about 2 wt. to about 80 wt. %, more typically from about 5 wt. % to about 70 wt. %, still more typically about 10 wt. % to about 60 wt. %, relative to the combined weight of the metallic nanoparticles and the doped or undoped polythiophene. In an embodiment, the amount of the metallic nanoparticles is from about 20 wt. % to about 55 wt. %, typically from about 25 wt. to about 50 wt. %, relative to the combined weight of the metallic nanoparticles and the doped or undoped polythiophene.

The non-aqueous ink composition of the present disclosure may optionally further comprise one or more matrix compounds known to be useful in hole injection layers (HILs) or hole transport layers (HTLs).

The optional matrix compound can be a lower or higher molecular weight compound, and is different from the polythiophene described herein. The matrix compound can be, for example, a synthetic polymer that is different from the polythiophene. See, for example, US Patent Publication No. 2006/0175582 published Aug. 10, 2006. The synthetic polymer can comprise, for example, a carbon backbone. In some embodiments, the synthetic polymer has at least one polymer side group comprising an oxygen atom or a nitrogen atom. The synthetic polymer may be a Lewis base. Typically, the synthetic polymer comprises a carbon backbone and has a glass transition temperature of greater than 25° C. The synthetic polymer may also be a semi-crystalline or crystalline polymer that has a glass transition temperature equal to or lower than 25° C. and/or a melting point greater than 25° C. The synthetic polymer may comprise acidic groups. For example, the synthetic polymer may be a polymeric acid comprising one or more repeating units comprising at least one alkyl or alkoxy group which is substituted by at least one fluorine atom and at least one sulfonic acid ($-SO_3H$) moiety, wherein said alkyl or alkoxy group is optionally interrupted by at least one ether linkage ($-O-$) group. Such polymeric acids are, for instance, those marketed by E. I. DuPont under the trade name NAFION®, those marketed by Solvay Specialty Polymers under the trade name AQUIVION®, or those marketed by Asahi Glass Co. under the trade name FLEMION®.

The optional matrix compound can be a planarizing agent. A matrix compound or a planarizing agent may be comprised of, for example, a polymer or oligomer such as an organic polymer, such as poly(styrene) or poly(styrene) derivatives; poly(vinyl acetate) or derivatives thereof; poly (ethylene glycol) or derivatives thereof; poly(ethylene-co-vinyl acetate); poly(pyrrolidone) or derivatives thereof (e.g., poly(l-vinylpyrrolidone-co-vinyl acetate)); poly(vinyl pyridine) or derivatives thereof; poly(methyl methacrylate) or derivatives thereof; poly(butyl acrylate); poly(aryl ether ketones); poly(aryl sulfones); poly(esters) or derivatives thereof; or combinations thereof.

The optional matrix compound or planarizing agent may be comprised of, for example, at least one semiconducting matrix component. The semiconducting matrix component is different from the polythiophene described herein. The semiconducting matrix component can be a semiconducting small molecule or a semiconducting polymer that is typically comprised of repeat units comprising hole carrying units in the main-chain and/or in a side-chain. The semiconducting matrix component may be in the neutral form or may be doped, and is typically soluble and/or dispersible in organic solvents, such as toluene, chloroform, acetonitrile, cyclohexanone, anisole, chlorobenzene, o-dichlorobenzene, ethyl benzoate and mixtures thereof.

The amount of the optional matrix compound can be controlled and measured as a weight percentage relative to the amount of the doped or undoped polythiophene. In an embodiment, the amount of the optional matrix compound is from 0 to 99.5 wt. %, typically from about 10 wt. to about 98 wt. %, more typically from about 20 wt. % to about 95 wt. %, still more typically about 25 wt. % to about 45 wt. %, relative to the amount of the doped or undoped polythiophene. In the embodiment with 0 wt. %, the ink composition is free of matrix compound.

The ink compositions of the present disclosure are non-aqueous. As used herein, "non-aqueous" means that the total amount of water present in the ink compositions of the present disclosure is from 0 to 5% wt., with respect to the total amount of the liquid carrier. Typically, the total amount of water in the ink composition is from 0 to 2% wt, more typically from 0 to 1% wt, even more typically from 0 to 0.5% wt, with respect to the total amount of the liquid carrier. In an embodiment, the ink composition of the present disclosure is free of any water.

The liquid carrier used in the ink composition according to the present disclosure comprises one or more organic solvents. In an embodiment, the ink composition consists essentially of or consists of one or more organic solvents. The liquid carrier may be an organic solvent or solvent blend comprising two or more organic solvents adapted for use and processing with other layers in a device such as the anode or light emitting layer.

Organic solvents suitable for use in the liquid carrier include, but are not limited to, aliphatic and aromatic ketones, tetrahydrofuran (THF), tetrahydropyran (THP), chloroform, alkylated benzenes, such as xylene and isomers thereof, halogenated benzenes, N-methylpyrrolidinone (NMP), dimethylformamide (DMF), dimethylacetamide (DMAc), dimethyl sulfoxide (DMSO), dichloromethane, acetonitrile, dioxanes, ethyl acetate, ethyl benzoate, methyl benzoate, dimethyl carbonate, ethylene carbonate, propylene carbonate, 3-methoxypropionitrile, 3-ethoxypropionitrile, or combinations thereof.

Aliphatic and aromatic ketones include, but are not limited to, acetone, acetonyl acetone, methyl ethyl ketone (MEK), methyl isobutyl ketone, methyl isobutenyl ketone, 2-hexanone, 2-pentanone, acetophenone, ethyl phenyl ketone, cyclohexanone, and cyclopentanone. In some embodiments, ketones with protons on the carbon located alpha to the ketone are avoided, such as cyclohexanone, methyl ethyl ketone, and acetone.

Other organic solvents might also be considered that solubilize, completely or partially, the polythiophene polymer or that swell the polythiophene polymer. Such other solvents may be included in the liquid carrier in varying quantities to modify ink properties such as wetting, viscosity, morphology control. The liquid carrier may further comprise one or more organic solvents that act as non-solvents for the polythiophene polymer.

Other organic solvents suitable for use according to the present disclosure include ethers such as anisole, ethoxybenzene, dimethoxy benzenes and glycol ethers, such as, ethylene glycol diethers, such as 1,2-dimethoxyethane, 1,2-diethoxyethane, and 1,2-dibutoxyethane; diethylene glycol diethers such as diethylene glycol dimethyl ether, and diethylene glycol diethyl ether; propylene glycol diethers such as propylene glycol dimethyl ether, propylene glycol diethyl ether, and propylene glycol dibutyl ether; dipropylene glycol diethers, such as dipropylene glycol dimethyl ether, dipropylene glycol diethyl ether, and dipropylene glycol dibutyl ether; as well as higher analogues (i.e., tri- and tetra-analogues) of the ethylene glycol and propylene glycol ethers mentioned herein.

Still other solvents can be considered, such as ethylene glycol monoether acetates and propylene glycol monoether acetates, wherein the ether can be selected, for example, from methyl, ethyl, n-propyl, iso-propyl, n-butyl, sec-butyl, tert-butyl, and cyclohexyl. Also, higher glycol ether analogues of above list such as di-, tri- and tetra-. Examples include, but are not limited to, propylene glycol methyl ether acetate, 2-ethoxyethyl acetate, 2-butoxyethyl acetate.

Alcohols may also be considered for use in the liquid carrier, such as, for example, methanol, ethanol, trifluoroethanol, n-propanol, isopropanol, n-butanol, t-butanol, ethylene glycol monohexyl ether (hexyl Cellosolve), propylene glycol monobutyl ether (Dowanol PnB), diethylene glycol monoethyl ether (ethyl Carbitol), dipropylene glycol n-butyl ether (Dowanol DPnB), diethylene glycol monophenyl ether (phenyl Carbitol), ethylene glycol monobutyl ether (butyl Cellosolve), diethylene glycol monobutyl ether (butyl Carbitol), dipropylene glycol monomethyl ether (Dowanol DPM), diisobutyl carbinol, 2-ethylhexyl alcohol, methyl isobutyl carbinol, ethylene glycol monophenyl ether (Dowanol Eph), propylene glycol monopropyl ether (Dowanol PnP), propylene glycol monophenyl ether (Dowanol PPh), diethylene glycol monopropyl ether (propyl Carbitol), diethylene glycol monohexyl ether (hexyl Carbitol), 2-ethylhexyl carbitol, dipropylene glycol monopropyl ether (Dowanol DPnP), tripropylene glycol monomethyl ether (Dowanol TPM), diethylene glycol monomethyl ether (methyl Carbitol), and tripropylene glycol monobutyl ether (Dowanol TPnB).

As disclosed herein, the organic solvents disclosed herein can be used in varying proportions in the liquid carrier, for example, to improve the ink characteristics such as substrate wettability, ease of solvent removal, viscosity, surface tension, and jettability.

In some embodiments, the use of aprotic non-polar solvents can provide the additional benefit of increased lifetimes of devices with emitter technologies which are sensitive to protons, such as, for example, PHOLEDs.

In an embodiment, the liquid carrier is a 2:1 anisole:3-methoxypropionitrile blend.

In another embodiment, the liquid carrier is N-methylpyrrolidinone.

In an embodiment, the liquid carrier is o-xylene.

The amount of liquid carrier in the ink composition according to the present disclosure is from about 50 wt. % to about 99 wt. %, typically from about 75 wt. % to about 98 wt. %, still more typically from about 90 wt. % to about 95 wt. %, with respect to the total amount of ink composition.

The total solids content (% TS) in the ink composition according to the present disclosure is from about 0.1 wt. % to about 50 wt. %, typically from about 0.3 wt. % to about 40 wt. %, more typically from about 0.5 wt. % to about 15 wt. %, still more typically from about 1 wt. % to about 5 wt. %, with respect to the total amount of ink composition.

The non-aqueous ink compositions of the present disclosure may be prepared according to any method known to those of ordinary skill in the art. For example, the doped or undoped polythiophene may be dissolved or dispersed in one or more solvents to provide a base mixture. The base mixture is then mixed with another mixture comprising the metallic nanoparticles in one or more solvents, which may be the same as or different from the solvent or solvents of the base mixture.

The ink composition according to the present disclosure can be cast and annealed as a film on a substrate.

Thus, the present disclosure also relates to a process for forming a hole-carrying film, the process comprising:
  1) coating a substrate with a non-aqueous ink composition disclosed herein; and
  2) annealing the coating on the substrate, thereby forming the hole-carrying film.

The coating of the ink composition on a substrate can be carried out by methods known in the art including, for example, spin casting, spin coating, dip casting, dip coating, slot-dye coating, ink jet printing, gravure coating, doctor blading, and any other methods known in the art for fabrication of, for example, organic electronic devices.

The substrate can be flexible or rigid, organic or inorganic. Suitable substrate compounds include, for example, glass, including, for example, display glass, ceramic, metal, and plastic films.

As used herein, the term "annealing" refers to the process of heating the coating layered on the substrate to a certain temperature (annealing temperature), maintaining the temperature for a certain period of time (annealing time), and then allowing the resulting layer, typically a film, to slowly cool to room temperature. The process of annealing may improve the mechanical and/or electrical properties of the polythiophene polymer by, for example, reducing or removing internal stresses and strains, reducing or removing defects, and aligning the polymer chains to improve structural ordering. It would be understood by the ordinarily-skilled artisan that the liquid carrier may be partially or completely evaporated during the course of the annealing process.

The step of annealing can be carried out by heating the substrate coated with the ink composition using any method known to those of ordinary skill in the art, for example, by heating in an oven or on a hot plate. Annealing can be carried out under an inert environment, for example, nitrogen atmosphere or noble gas atmosphere, such as, for example, argon gas. Annealing may be carried out in air atmosphere.

The annealing time is the time for which the annealing temperature is maintained. The annealing time is from about 5 to about 40 minutes, typically from about 15 to about 30 minutes.

In an embodiment, the annealing temperature is from about 25° C. to about 300° C., typically 150° C. to about 250° C., and the annealing time is from about 5 to about 40 minutes, typically for about 15 to about 30 minutes.

The present disclosure relates to the hole-carrying film formed by the process described herein.

Transmission of visible light is important, and good transmission (low absorption) at higher film thicknesses is particularly important. For example, the film made according to the process of the present disclosure can exhibit a transmittance (typically, with a substrate) of at least about 85%, typically at least about 90%, of light having a wavelength of about 380-800 nm. In an embodiment, the transmittance is at least about 90%.

In one embodiment, the film made according to the process of the present disclosure has a thickness of from about 5 nm to about 500 nm, typically from about 5 nm to about 150 nm, more typically from about 50 nm to about 120 nm.

In an embodiment, the film made according to the process of the present disclosure exhibits a transmittance of at least about 90% and has a thickness of from about 5 nm to about 500 nm, typically from about 5 nm to about 150 nm, more typically from about 50 nm to 120 nm. In an embodiment, the film made according to the process of the present disclosure exhibits a transmittance (% T) of at least about 90% and has a thickness of from about 50 nm to 120 nm.

The refractive index, herein designated as the n value, of the films described herein is from about 1.500 to about 1.700, typically from about 1.510 to about 1.690, more typically from about 1.520 to about 1.660, when measured with light having a wavelength of about 380-800 nm.

The films made according to the processes of the present disclosure may be made on a substrate optionally containing an electrode or additional layers used to improve electronic properties of a final device. The resulting films may be intractable to one or more organic solvents, which can be the solvent or solvents used as liquid carrier in the ink for subsequently coated or deposited layers during fabrication of a device. The films may be intractable to, for example, toluene, which can be the solvent in the ink for subsequently coated or deposited layers during fabrication of a device.

The present disclosure also relates to a device comprising a film prepared according to the processes described herein. The devices described herein can be made by methods known in the art including, for example, solution processing. Inks can be applied and solvents removed by standard methods. The film prepared according to the processes described herein may be an HIL and/or HTL layer in the device.

Methods are known in the art and can be used to fabricate organic electronic devices including, for example, OLED and OPV devices. Methods known in the art can be used to measure brightness, efficiency, and lifetimes. Organic light emitting diodes (OLED) are described, for example, in U.S. Pat. Nos. 4,356,429 and 4,539,507 (Kodak). Conducting polymers which emit light are described, for example, in U.S. Pat. Nos. 5,247,190 and 5,401,827 (Cambridge Display Technologies). Device architecture, physical principles, solution processing, multilayering, blends, and compounds synthesis and formulation are described in Kraft et al., "Electroluminescent Conjugated Polymers—Seeing Polymers in a New Light," Angew. Chem. Int. Ed., 1998, 37, 402-428, which is hereby incorporated by reference in its entirety.

Light emitters known in the art and commercially available can be used including various conducting polymers as well as organic molecules, such as compounds available from Sumation, Merck Yellow, Merck Blue, American Dye Sources (ADS), Kodak (e.g., A1Q3 and the like), and even Aldrich, such as BEHP-PPV. Examples of such organic electroluminescent compounds include:
(i) poly(p-phenylene vinylene) and its derivatives substituted at various positions on the phenylene moiety;
(ii) poly(p-phenylene vinylene) and its derivatives substituted at various positions on the vinylene moiety;
(iii) poly(p-phenylene vinylene) and its derivatives substituted at various positions on the phenylene moiety and also substituted at various positions on the vinylene moiety;
(iv) poly(arylene vinylene), where the arylene may be such moieties as naphthalene, anthracene, furylene, thienylene, oxadiazole, and the like;
(v) derivatives of poly(arylene vinylene), where the arylene may be as in (iv) above, and additionally have substituents at various positions on the arylene;
(vi) derivatives of poly(arylene vinylene), where the arylene may be as in (iv) above, and additionally have substituents at various positions on the vinylene;
(vii) derivatives of poly(arylene vinylene), where the arylene may be as in (iv) above, and additionally have substituents at various positions on the arylene and substituents at various positions on the vinylene;
(viii) co-polymers of arylene vinylene oligomers, such as those in (iv), (v), (vi), and (vii) with non-conjugated oligomers; and
(ix) poly(p-phenylene) and its derivatives substituted at various positions on the phenylene moiety, including ladder polymer derivatives such as poly(9,9-dialkyl fluorene) and the like;
(x) poly(arylenes) where the arylene may be such moieties as naphthalene, anthracene, furylene, thienylene, oxadiazole, and the like; and their derivatives substituted at various positions on the arylene moiety;
(xi) co-polymers of oligoarylenes, such as those in (x) with non-conjugated oligomers;
(xii) polyquinoline and its derivatives;
(xiii) co-polymers of polyquinoline with p-phenylene substituted on the phenylene with, for example, alkyl or alkoxy groups to provide solubility; and
(xiv) rigid rod polymers, such as poly(p-phenylene-2,6-benzobisthiazole), poly(p-phenylene-2,6-benzobisoxazole), poly(p-phenylene-2,6-benzimidazole), and their derivatives;
(xv) polyfluorene polymers and co-polymers with polyfluorene units.

Preferred organic emissive polymers include SUMATION Light Emitting Polymers ("LEPs") that emit green, red, blue, or white light or their families, copolymers, derivatives, or mixtures thereof; the SUMATION LEPs are available from Sumation KK. Other polymers include polyspirofluorene-like polymers available from Covion Organic Semiconductors GmbH, Frankfurt, Germany (now owned by Merck®).

Alternatively, rather than polymers, small organic molecules that emit by fluorescence or by phosphorescence can serve as the organic electroluminescent layer. Examples of small-molecule organic electroluminescent compounds include: (i) tris(8-hydroxyquinolinato) aluminum (Alq); (ii) 1,3-bis(N,N-dimethylaminophenyl)-1,3,4-oxidazole (OXD-8); (iii) -oxo-bis(2-methyl-8-quinolinato)aluminum; (iv) bis (2-methyl-8-hydroxyquinolinato) aluminum; (v) bis(hydroxybenzoquinolinato) beryllium ($BeQ_2$); (vi) bis (diphenylvinyl)biphenylene (DPVBI); and (vii) arylamine-substituted distyrylarylene (DSA amine).

Such polymer and small-molecule compounds are well known in the art and are described in, for example, U.S. Pat. No. 5,047,687.

The devices can be fabricated in many cases using multilayered structures which can be prepared by, for example, solution or vacuum processing, as well as printing and patterning processes. In particular, use of the embodiments described herein for hole injection layers (HILs), wherein the composition is formulated for use as a hole injection layer, can be carried out effectively.

Examples of HIL in devices include:
1) Hole injection in OLEDs including PLEDs and SMOLEDs; for example, for HIL in PLED, all classes of conjugated polymeric emitters where the conjugation involves carbon or silicon atoms can be used. For HIL in SMOLED, the following are examples: SMOLED containing fluorescent emitters; SMOLED containing phosphorescent emitters; SMOLEDs comprising one or more organic layers in addition to the HIL layer; and SMOLEDs where the small molecule layer is processed from solution or aerosol spray or any other processing methodology. In addition, other examples include HIL in dendrimer or oligomeric organic semiconductor based OLEDs; HIL in ambipolar light emitting FET's where the HIL is used to modify charge injection or as an electrode;

2) Hole extraction layer in OPV;
3) Channel material in transistors;
4) Channel material in circuits comprising a combination of transistors, such as logic gates;
5) Electrode material in transistors;
6) Gate layer in a capacitor;
7) Chemical sensor where modification of doping level is achieved due to association of the species to be sensed with the conductive polymer;
8) Electrode or electrolyte material in batteries.

A variety of photoactive layers can be used in OPV devices. Photovoltaic devices can be prepared with photoactive layers comprising fullerene derivatives mixed with, for example, conducting polymers as described in, for example, U.S. Pat. Nos. 5,454,880; 6,812,399; and 6,933,436. Photoactive layers may comprise blends of conducting polymers, blends of conducting polymers and semiconducting nanoparticles, and bilayers of small molecules such as pthalocyanines, fullerenes, and porphyrins.

Common electrode compounds and substrates, as well as encapsulating compounds can be used.

In one embodiment, the cathode comprises Au, Ca, Al, Ag, or combinations thereof. In one embodiment, the anode comprises indium tin oxide. In one embodiment, the light emission layer comprises at least one organic compound.

Interfacial modification layers, such as, for example, interlayers, and optical spacer layers may be used.

Electron transport layers can be used.

The present disclosure also relates to a method of making a device described herein.

In an embodiment, the method of making a device comprises: providing a substrate; layering a transparent conductor, such as, for example, indium tin oxide, on the substrate; providing the ink composition described herein; layering the ink composition on the transparent conductor to form a hole injection layer or hole transport layer; layering an active layer on the hole injection layer or hole transport layer (HTL); and layering a cathode on the active layer.

As described herein, the substrate can be flexible or rigid, organic or inorganic. Suitable substrate compounds include, for example, glass, ceramic, metal, and plastic films.

In another embodiment, a method of making a device comprises applying the ink composition as described herein as part of an HIL or HTL layer in an OLED, a photovoltaic device, an ESD, a SMOLED, a PLED, a sensor, a supercapacitor, a cation transducer, a drug release device, an electrochromic device, a transistor, a field effect transistor, an electrode modifier, an electrode modifier for an organic field transistor, an actuator, or a transparent electrode.

The layering of the ink composition to form the HIL or HTL layer can be carried out by methods known in the art including, for example, spin casting, spin coating, dip casting, dip coating, slot-dye coating, ink jet printing, gravure coating, doctor blading, and any other methods known in the art for fabrication of, for example, organic electronic devices.

In one embodiment, the HIL layer is thermally annealed. In one embodiment, the HIL layer is thermally annealed at temperature of about 25° C. to about 300° C., typically 150° C. to about 250° C. In one embodiment, the HIL layer is thermally annealed at temperature of about 25° C. to about 300° C., typically 150° C. to about 250° C., for about 5 to about 40 minutes, typically for about 15 to about 30 minutes.

In accordance with the present disclosure, an HIL or HTL can be prepared that can exhibit a transmittance (typically, with a substrate) of at least about 85%, typically at least about 90%, of light having a wavelength of about 380-800 nm. In an embodiment, the transmittance is at least about 90%.

In one embodiment, the HIL layer has a thickness of from about 5 nm to about 500 nm, typically from about 5 nm to about 150 nm, more typically from about 50 nm to 120 nm.

In an embodiment, the HIL layer exhibits a transmittance of at least about 90% and has a thickness of from about 5 nm to about 500 nm, typically from about 5 nm to about 150 nm, more typically from about 50 nm to 120 nm. In an embodiment, the HIL layer exhibits a transmittance (% T) of at least about 90% and has a thickness of from about 50 nm to 120 nm.

The inks, methods and processes, films, and devices according to the present disclosure are further illustrated by the following non-limiting examples.

Example 1. Preparation of Non-Aqueous (NQ) Ink Compositions

The components used in the following examples are summarized in the Table 1.

TABLE 1

Summary of components

| | |
|---|---|
| Polymer A | Tetrakis(pentafluorophenyl)borate-doped poly(3,4-diBEET) |
| Polymer B | Tetrakis(pentafluorophenyl)borate-doped poly(3,4-diPPT) |
| AP21 | Anisole:3-methoxypropionitrile blend (2:1 by weight) |
| NMP | N-methylpyrrolidinone |
| PixClear™ PA | $ZrO_2$ nanoparticles with non-reactive organic capping agent (50 wt % dispersion in propylene glycol methyl ether acetate); available from Pixelligent |
| PixClear™ PB | $ZrO_2$ nanoparticles with reactive organic capping agent (50 wt % dispersion in propylene glycol methyl ether acetate); available from Pixelligent |
| PixClear™ PM | $ZrO_2$ nanoparticles with reactive organic capping agent (50 wt % dispersion in propylene glycol methyl ether acetate); available from Pixelligent |
| PixClear™ PN | $ZrO_2$ nanoparticles with non-reactive organic capping agent (50 wt % dispersion in propylene glycol methyl ether acetate); available from Pixelligent |
| PixClear™ PG | $ZrO_2$ nanoparticles with non-reactive organic capping agent (50 wt % dispersion in propylene glycol methyl ether acetate); available from Pixelligent |

Base mixtures were prepared by dissolving or dispersing a doped polymer in one or more solvents such that the doped polymer content was about 2.5 wt % relative to the total amount of base mixture. The base mixtures made are summarized in the following Table 2.

TABLE 2

Base mixtures (2.5 wt % doped polymer)

| Base mixture | Doped polymer | Solvent |
|---|---|---|
| 1 | Polymer A | AP21 |
| 2 | Polymer B | AP21 |
| 3 | Polymer B | NMP |

$ZrO_2$ stock mixtures were prepared by diluting commercially-available dispersions of $ZrO_2$ nanoparticles with either AP21 or NMP such that the $ZrO_2$ nanoparticle content was about 2.5 wt % relative to the total amount of $ZrO_2$ stock mixture. The $ZrO_2$ stock mixtures made are summarized in the following Table 3.

TABLE 3

$ZrO_2$ stock mixtures (2.5 wt % $ZrO_2$ nanoparticle content)

| $ZrO_2$ stock mixture | Commercial dispersion | Dilution solvent |
|---|---|---|
| 1 | PixClear ™ PA | AP21 |
| 2 | PixClear ™ PB | AP21 |
| 3 | PixClear ™ PM | AP21 |
| 4 | PixClear ™ PN | AP21 |
| 5 | PixClear ™ PG | AP21 |
| 6 | PixClear ™ PA | NMP |
| 7 | PixClear ™ PB | NMP |
| 8 | PixClear ™ PM | NMP |
| 9 | PixClear ™ PN | NMP |
| 10 | PixClear ™ PG | NMP |

The $ZrO_2$ stock mixtures summarized in Table 3 were all clear with no particle formation and filterable after one week and after one month.

The inventive NQ inks were prepared by mixing an amount of base mixture with an amount of $ZrO_2$ mixture having the same solvent or solvent blend as the base mixture such that the desired doped polymer/$ZrO_2$ nanoparticle content, expressed as wt % relative to the total amount of NQ ink, and the desired $ZrO_2$ solid % was achieved. As used herein, the $ZrO_2$ solid % refers to the weight percentage of $ZrO_2$ nanoparticles relative to the combined weight of doped polymer and $ZrO_2$ nanoparticles. All of the NQ inks formed were stable after one week without particle formation, as judged by visual observation, and were easy to filter through 0.45 μm PTFE filters. The inventive NQ inks made are summarized below in Table 4.

TABLE 4

Inventive NQ inks

| NQ ink | Base mixture used | $ZrO_2$ stock mixture used | Doped polymer/$ZrO_2$ nanoparticle content (%) | $ZrO_2$ solid % |
|---|---|---|---|---|
| 1 | 1 | 1 | 2.5 | 50 |
| 2 | 1 | 2 | 2.5 | 50 |
| 3 | 1 | 3 | 2.5 | 50 |
| 4 | 1 | 4 | 2.5 | 50 |
| 5 | 1 | 5 | 2.5 | 50 |
| 6 | 2 | 1 | 15 | 87 |
| 7 | 2 | 2 | 15 | 87 |
| 8 | 2 | 3 | 15 | 87 |
| 9 | 2 | 4 | 15 | 87 |
| 10 | 2 | 5 | 15 | 87 |
| 11 | 2 | 1 | 9 | 75 |
| 12 | 2 | 2 | 9 | 75 |
| 13 | 2 | 3 | 9 | 75 |
| 14 | 2 | 4 | 9 | 75 |
| 15 | 2 | 5 | 9 | 75 |
| 16 | 2 | 1 | 6 | 67 |
| 17 | 2 | 2 | 6 | 67 |
| 18 | 2 | 3 | 6 | 67 |
| 19 | 2 | 4 | 6 | 67 |
| 20 | 2 | 5 | 6 | 67 |
| 21 | 2 | 1 | 2.5 | 50 |
| 22 | 2 | 2 | 2.5 | 50 |
| 23 | 2 | 3 | 2.5 | 50 |
| 24 | 2 | 4 | 2.5 | 50 |
| 25 | 2 | 5 | 2.5 | 50 |
| 26 | 2 | 1 | 2.5 | 25 |
| 27 | 2 | 2 | 2.5 | 25 |
| 28 | 2 | 3 | 2.5 | 25 |
| 29 | 2 | 4 | 2.5 | 25 |
| 30 | 2 | 5 | 2.5 | 25 |
| 31 | 3 | 1 | 2.5 | 50 |
| 32 | 3 | 2 | 2.5 | 50 |
| 33 | 3 | 3 | 2.5 | 50 |
| 34 | 3 | 4 | 2.5 | 50 |
| 35 | 3 | 5 | 2.5 | 50 |

Example 2. Film Formation and Properties

Films were formed using standard film processing conditions, i.e., spin-coating using a Laurel spin coater at 2000 rpm for 90 seconds, and annealing on hot plate at 200° C. for 30 minutes. The quality of the films formed from the inventive NQ inks was judged by comparing the films with those formed from the corresponding base mixture alone using in-line images and microscope image at 1000× magnification.

Films formed from fifteen of the inventive inks of Example 1 in which the doped polymer/$ZrO_2$ nanoparticle content was 2.5% and the $ZrO_2$ solid % was 50% (NQ inks 1-5, 21-25, and 31-35) were evaluated. As shown in the results summarized below in Table 5, films formed from NQ inks 1-5 show some particle formation, and those obtained from NQ inks 31-35 show many particles and phase segregation. NQ inks 21-25 formed films comparable to those made from the base mixture without nanoparticles. The film thickness was around 30-40 nm, which is similar to those made from the base mixtures. Images of the films formed from NQ inks 1-5, 21-25, and 31-35 under 1000× magnification are shown in FIG. 1.

TABLE 5

Film quality

| NQ ink | Film quality |
|---|---|
| 1 | ○ |
| 2 | ○ |
| 3 | X |
| 4 | X |
| 5 | ○ |
| 21 | ○ |
| 22 | ○ |
| 23 | ○ |
| 24 | ○ |
| 25 | ○ |
| 31 | XX |
| 32 | XX |
| 33 | XX |
| 34 | XX |
| 35 | X |

○: good
X: many particles
XX: many particles and phase segregation

The effect of $ZrO_2$ solid % on film formation and properties was investigated. Films were made using standard film processing conditions from NQ inks 6-30, and were evaluated. The films formed by high $ZrO_2$ solid % (>50%, such as 67%, 75% and 87%) showed phase separation and many particles. The NQ inks having 25% and 50% $ZrO_2$ solid %, NQ inks 26-30 and 21-25, respectively, gave films comparable to those made from the corresponding base mixture without nanoparticles. Images of the films formed from NQ inks 6-30 under 1000× magnification are shown in FIG. 2.

Film thickness, transmittance, and absorption spectra, were also determined for the films made from NQ inks 6-30. The higher $ZrO_2$ solid % (87% and 75%) with higher doped polymer/$ZrO_2$ nanoparticle content gave thicker films (97 and 175 nm), but showed de-doping in absorption spectra and their transmission (80-87%) did not meet the transmittance requirement of >90%, but was promising for thick films (97 and 175 nm). The medium $ZrO_2$ solid % (65%) films had good transmittance, but de-doping occurred during film formation, and film quality was not good. The low $ZrO_2$ solid % (25% and 50%) films had good film quality and thickness when compared to films made from the corresponding nanoparticle-free ink, >90% transmittance, and no de-doping during film formation. The properties of the films made from the 25% and 50% $ZrO_2$ inks were similar. The results are summarized below in Table 6.

TABLE 6

| $ZrO_2$ solid % | 87% | 75% | 67% | 50% | 25% |
|---|---|---|---|---|---|
| doped polymer/$ZrO_2$ nanoparticle content (%) | 15% | 9% | 6% | 2.5% | 2.5% |
| Film formation | X | X | X | ○ | ○ |
| De-doping | Yes | Yes | Yes | No | No |
| T % (550 nm) | 81 | 85 | 92 | 97 | 96 |
| T % (800 nm) | 87 | 86 | 90 | 94 | 92 |
| Thickness (nm) | 175 | 97 | 45 | 30 | 40 |

X: phase segration
○: good

Among the 50% $ZrO_2$ films made from NQ inks 21-25, the work function was measured using AC2, and the value was around −5.25 eV, which is comparable to that of a film made from the corresponding base mixture 2, except −5.09 eV for the film made from NQ ink 21. The resistivity of the films made from NQ inks 22 and 25 were measured, and the value was about $1\times10^6$ Ω·cm, which was much higher than that of a film made from the corresponding base mixture 2, which is typically a couple hundred Ω·cm. The resistivity measured was the surface resistivity, which indicates that the $ZrO_2$ particles are on the film surface and make the resistivity increase dramatically.

Figure 3:
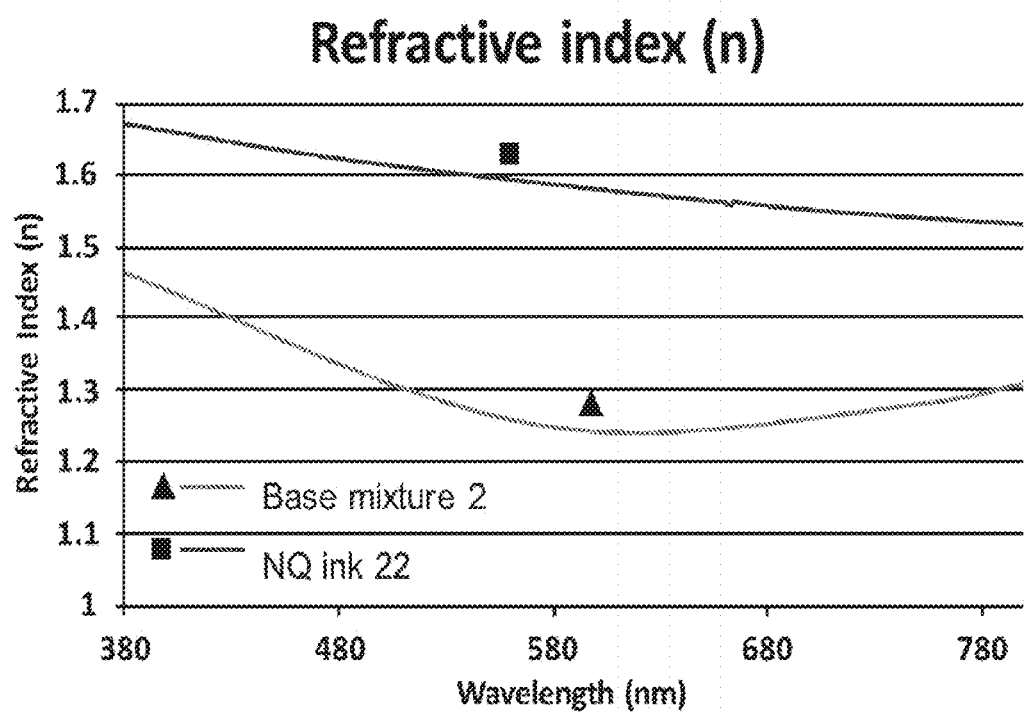
FIG. 3 shows a comparison of the refractive index (n value) of a film made from inventive NQ ink 22 and a film made from the corresponding nanoparticle-free ink, base mixture 2.
Figure 4:
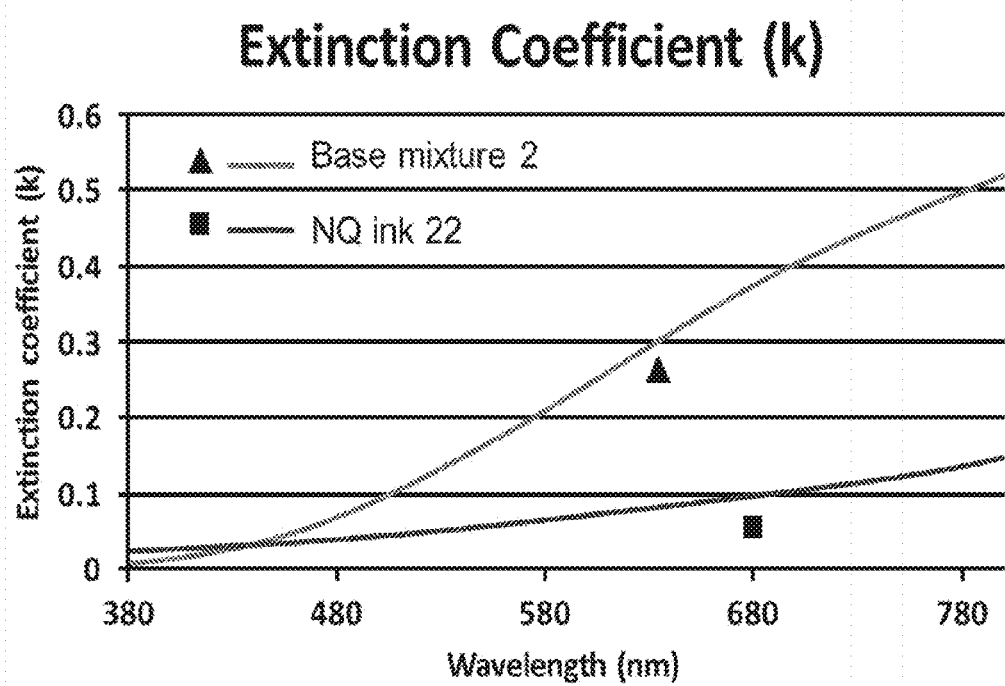
FIG. 4 shows a comparison of the extinction coefficient (k value) of a film made from inventive NQ ink 22 and a film made from the corresponding nanoparticle-free ink, base mixture 2.

The refractive index, herein designated the n value, and the extinction coefficient, herein designated the k value, in the visible spectral range of a film made from inventive NQ ink 22 was compared to a film made from the corresponding nanoparticle-free ink, base mixture 2. The comparison of the n value for a film made from inventive NQ ink 22 and a film made from the corresponding nanoparticle-free ink, base mixture 2, is shown in FIG. 3. The comparison of the k value for a film made from inventive NQ ink 22 and a film made from the corresponding nanoparticle-free ink, base mixture 2, is shown in FIG. 4. As shown in FIG. 3, the introduction of $ZrO_2$ nanoparticle into a film leads to an increase of refractive index. An increase in the refractive index of an HIL is often required in high efficiency OLED stacks with optical out-coupling layers, especially for OLED lighting application. In the visible range (400-800 nm), in comparison with the film made from base mixture 2, the refractive index (n value) of the film made from inventive NQ ink 22 increases 0.2-0.3, and its extinction coefficient (k value) decreases 0.1 to 0.37. The results are summarized in Table 7.

TABLE 7

| | Refractive index (n value) | | | Extinction coefficient (k value) | | |
|---|---|---|---|---|---|---|
| Wavelength | Base mixture 2 | NQ ink 22 | n value change | Base mixture 2 | NQ ink 22 | k value change |
| 401 nm | 1.437 | 1.658 | +0.221 | 0.013 | 0.027 | +0.014 |
| 500 nm | 1.266 | 1.596 | +0.330 | 0.165 | 0.057 | −0.108 |
| 801 nm | 1.308 | 1.529 | +0.221 | 0.522 | 0.147 | −0.375 |

Example 4. Unipolar Device Fabrication and Testing

The unipolar, single charge-carrier devices described herein were fabricated on indium tin oxide (ITO) surfaces deposited on glass substrates. The ITO surface was pre-patterned to define the pixel area of 0.05 $cm^2$. Before depositing an HIL ink composition on the substrates, pre-conditioning of the substrates was performed. The device substrates were first cleaned by ultrasonication in various solutions or solvents. The device substrates were ultrasonicated in a dilute soap solution, followed by distilled water, then acetone, and then isopropanol, each for about 20 minutes. The substrates were dried under nitrogen flow. Subsequently, the device substrates were then transferred to a vacuum oven set at 120° C. and kept under partial vacuum (with nitrogen purging) until ready for use. The device substrates were treated in a UV-Ozone chamber operating at 300 W for 20 minutes immediately prior to use.

Before the HIL ink composition is deposited onto an ITO surface, filtering of the ink composition through a PTFE 0.45-μm filter is performed.

The HIL was formed on the device substrate by spin coating. Generally, the thickness of the HIL after spin-coating onto the ITO-patterned substrates is determined by several parameters such as spin speed, spin time, substrate size, quality of the substrate surface, and the design of the spin-coater. General rules for obtaining certain layer thickness are known to those of ordinary skill in the art. After spin-coating, the HIL layer was dried on a hot plate, typically at a temperature (anneal temperature) of from 150° C. to 250° C. for 15-30 minutes.

The substrates comprising the inventive HIL layers were then transferred to a vacuum chamber where the remaining layers of the device stack were deposited by means of physical vapor deposition.

All steps in the coating and drying process are done under an inert atmosphere, unless otherwise stated.

N,N'-bis(1-naphtalenyl)-N,N'-bis(phenyl)benzidine (NPB) was deposited as a hole transport layer on top of the HIL followed by a gold (Au) or aluminum (Al) cathode. The typical device stack, including target film thickness, for the unipolar device, is ITO (220 nm)/HIL (100 nm)/NPB (150 nm)/Al (100 nm). This is a unipolar device wherein the hole-only injection efficiency of the HIL into the HTL is studied.

The unipolar device comprises pixels on a glass substrate whose electrodes extended outside the encapsulated area of the device which contain the light emitting portion of the pixels. The typical area of each pixel is 0.05 $cm^2$. The electrodes were contacted with a current source meter such as a Keithley 2400 source meter with a bias applied to the ITO electrode while the gold or aluminum electrode was earthed. This results in only positively charged carriers (holes) being injected into the device (hole-only device or HOD).

Figure 5:
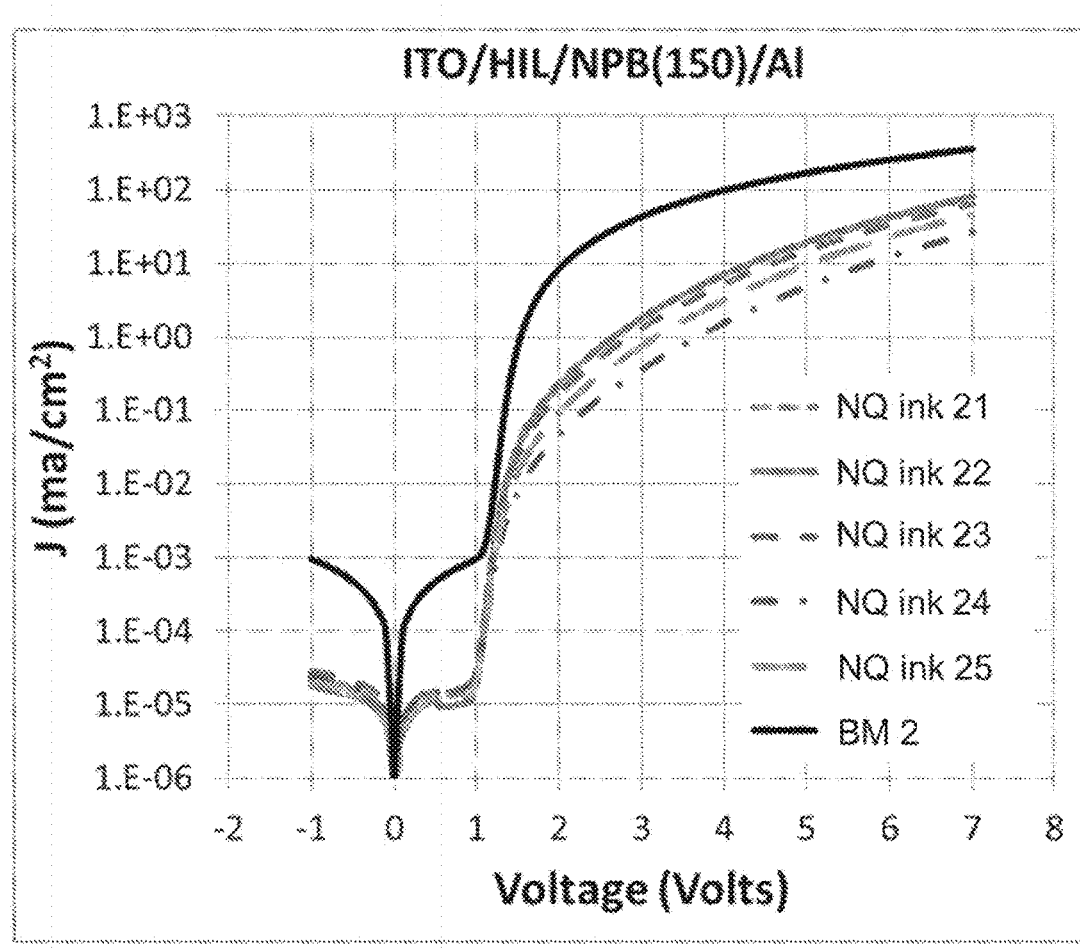
FIG. 5 shows the current-voltage dependencies of HOD devices with various HIL layers prepared from inventive NQ inks.

HILs made from five different inventive NQ inks (NQ inks 21-25) were screened in hole-only devices. Films were also prepared from the base mixture 2 (BM 2), which is free of nanoparticles, as comparative HIL film. FIG. 5 shows the current-voltage dependencies of HOD devices with various HIL layers prepared from the listed inks. The leakage currents of all HILs prepared from the inventive inks were as low as the comparative HIL prepared from BM 2. However, notably, a low current at forward bias was observed for the inventive HILs in comparison with the comparative device.

Figure 6:
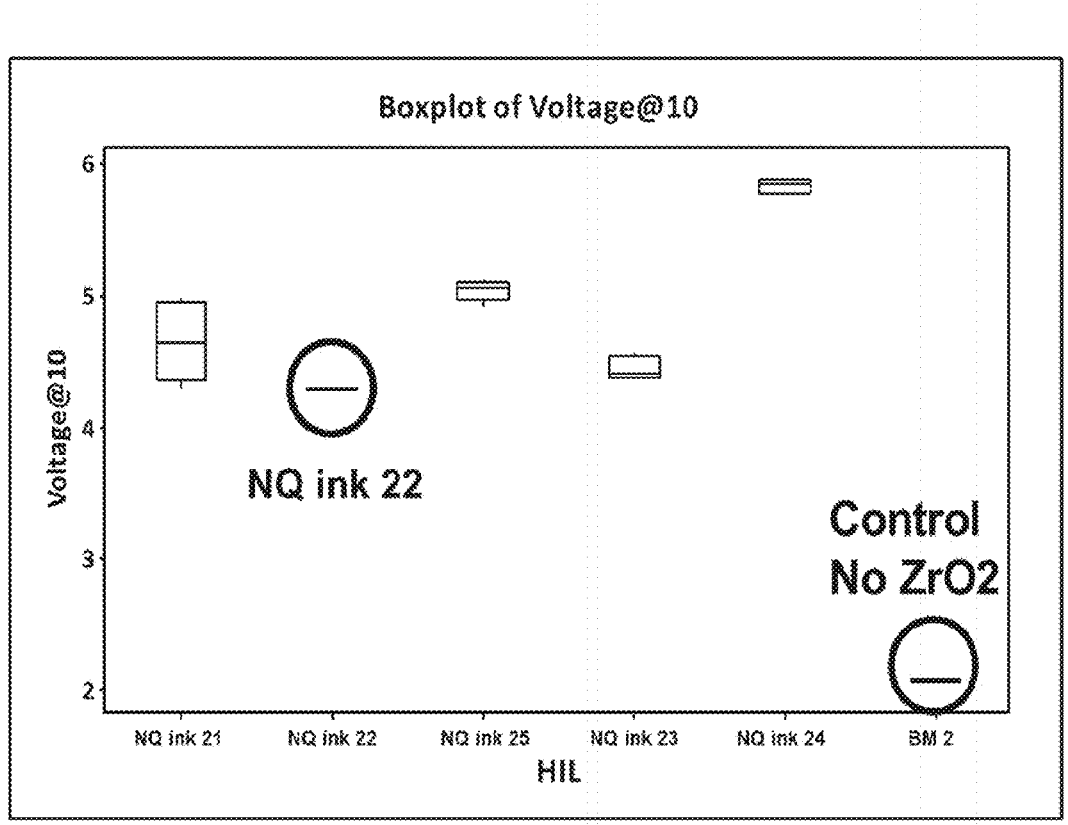
FIG. 6 shows the voltage at 10 mA/cm² in HOD devices having various HILs prepared from inventive NQ inks.

FIG. 6 shows the voltage at 10 mA/cm$^2$ in HOD devices having various HILs prepared from the listed inks. The HIL prepared from NQ ink 22 demonstrated the best voltage (lowest V at 10 mA/cm$^2$ among inks 21-25) and lowest variation in data.

Example 5. OLED Device Fabrication and Characterization

HILs were prepared from two inventive NQ HIL inks 27 and 22, with doped polymer-to-ZrO$_2$ nanoparticle ratio of 75:25 and 50:50, respectively, and screened in green P HOLED devices. HILs were also prepared from the base mixture 2 (BM 2), which is free of nanoparticles, as comparative HIL films.

The device fabrication described below is intended as an example and does not in any way imply the limitation of the invention to the said fabrication process, device architecture (sequence, number of layers, etc.) or materials other than the HIL materials claimed.

The OLED devices described herein were fabricated on indium tin oxide (ITO) surfaces deposited on glass substrates.

The ITO surface was pre-patterned to define the pixel area of 0.05 cm$^2$. Before depositing an NQ ink to form an HIL on the substrates, pre-conditioning of the substrates was performed. The device substrates were first cleaned by ultrasonication in various solutions or solvents. The device substrates were ultrasonicated in a dilute soap solution, followed by distilled water, then acetone, and then isopropanol, each for about 20 minutes. The substrates were dried under nitrogen flow. Subsequently, the device substrates were then transferred to a vacuum oven set at 120° C. and kept under partial vacuum (with nitrogen purging) until ready for use. The device substrates were treated in a UV-Ozone chamber operating at 300 W for 20 minutes immediately prior to use.

Before the HIL ink composition is deposited onto an ITO surface, filtering of the ink composition through a polypropylene 0.2-μm filter was performed.

The HIL was formed on the device substrate by spin coating the NQ ink. Generally, the thickness of the HIL after spin-coating onto the ITO-patterned substrates is determined by several parameters such as spin speed, spin time, substrate size, quality of the substrate surface, and the design of the spin-coater. General rules for obtaining certain layer thickness are known to those of ordinary skill in the art. After spin-coating, the HIL layer was dried on a hot plate, typically at a temperature (anneal temperature) of from 150° C. to 250° C. for 15-30 minutes.

The substrates comprising the inventive HIL layers were then transferred to a vacuum chamber where the remaining layers of the device stack were deposited by means of physical vapor deposition.

All steps in the coating and drying process are done under an inert atmosphere, unless otherwise stated.

N,N'-bis(1-naphtalenyl)-N,N'-bis(phenyl)benzidine (NPB) was deposited as a hole transport layer on top of the HIL followed by an iridium-based emissive layer, a tris(8-hydroxyquinolinato)aluminum (ALQ3) electron transport and emissive layer, and LiF and Al as cathode. The pre-patterned ITO on glass acts as the anode.

The OLED device comprises pixels on a glass substrate whose electrodes extended outside the encapsulated area of the device which contain the light emitting portion of the pixels. The typical area of each pixel is 0.05 cm$^2$. The electrodes were contacted with a current source meter such as a Keithley 2400 source meter with a bias applied to the ITO electrode while the aluminum electrode was earthed. This results in positively charged carriers (holes) and negatively charged carriers being injected into the device which form excitons and generate light. In this example, the HIL assists the injection of charge carriers into the light emitting layer.

Simultaneously, another Keithley 2400 source meter is used to address a large area silicon photodiode. This photodiode is maintained at zero volts bias by the 2400 source meter. It is placed in direct contact with area of the glass substrate directly below the lighted area of the OLED pixel. The photodiode collects the light generated by the OLED converting them into photocurrent which is in turn read by the source meter. The photodiode current generated is quantified into optical units (candelas/sq. meter) by calibrating it with the help of a Minolta CS-200 Chromameter.

During the testing of the device, the Keithley 2400 addressing the OLED pixel applies a voltage sweep to it. The resultant current passing through the pixel is measured. At the same time the current passing through the OLED pixel results in light being generated which then results in a photocurrent reading by the other Keithley 2400 connected to the photodiode. Thus the voltage-current-light or IVL data for the pixel is generated.

Figure 7:
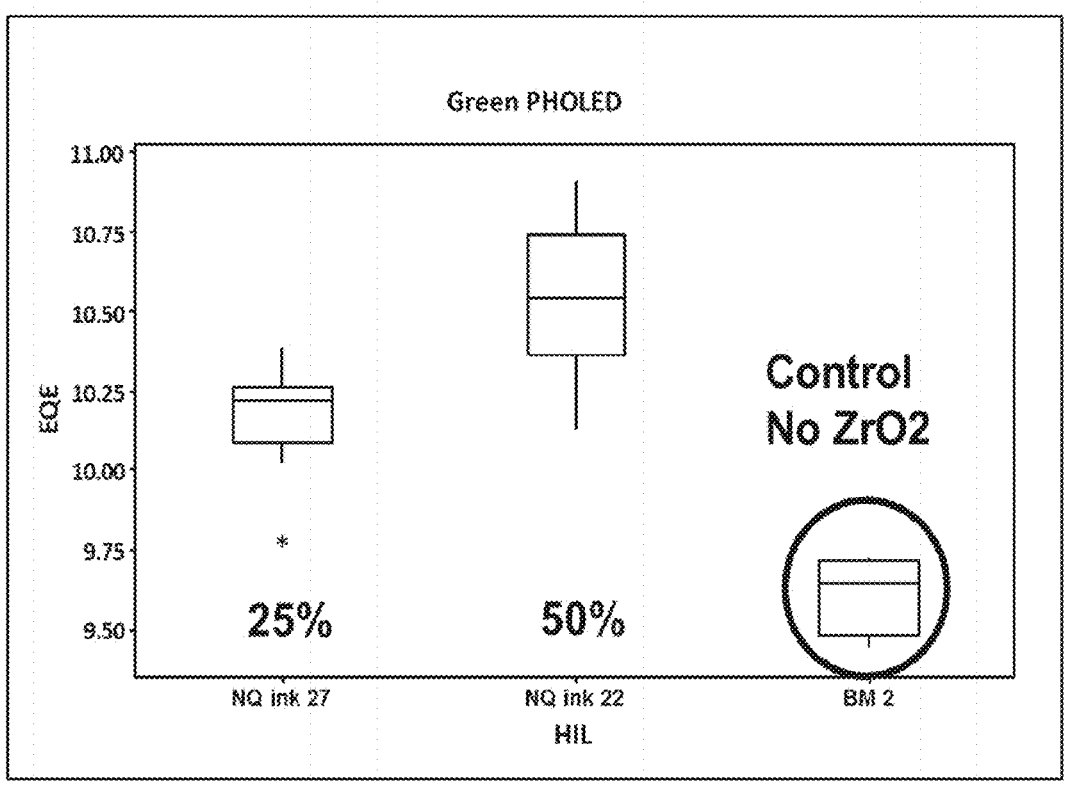
FIG. 7 shows the external quantum efficiency (EQE) in green PHOLED devices made from inventive NQ HIL inks 22 and 27, and BM 2.
Figure 8:
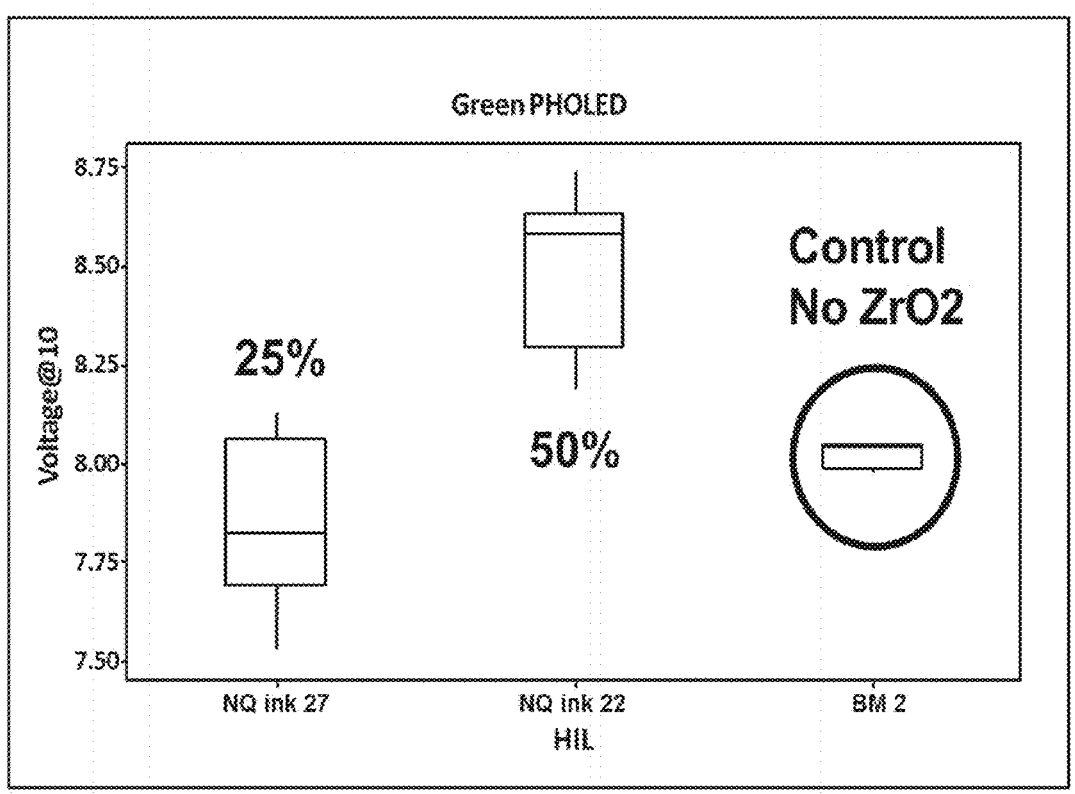
FIG. 8 shows the voltage at 10 mA/cm² in green PHOLED devices made from NQ HIL inks 22 and 27, and BM 2.

FIG. 7 shows the external quantum efficiency (EQE) and FIG. 8 shows the voltage at 10 mA/cm$^2$ in green PHOLED devices made from the two inventive NQ HIL inks 22 and 27, and BM 2. The HIL formed from NQ ink 22 demonstrated the highest EQE of 10.5% avg. in comparison with the HIL prepared from BM 2. However, the HIL formed from NQ ink 22 showed a voltage −0.6V higher than that of the HIL formed from BM 2.

Figure 9:
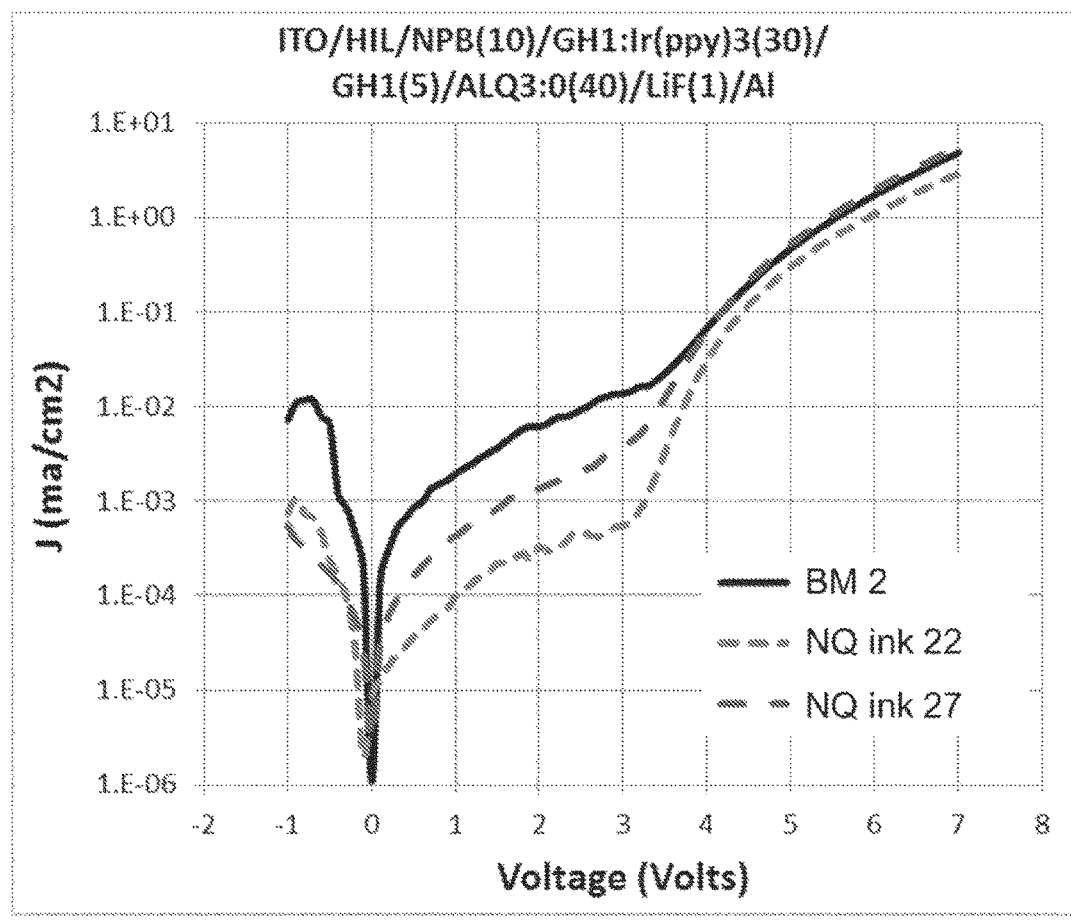
FIG. 9 shows the current-voltage dependences for green PHOLED devices made from NQ HIL inks 22 and 27 in comparison with that of devices made from BM 2.

FIG. 9 shows the current-voltage dependences for green PHOLED devices made from NQ HIL inks 22 and 27 in comparison with that of devices made from BM 2. The results confirm that the HIL made from ink 22 has slightly lower current due to high resistivity causing ohmic losses at high current densities.

Figure 10:
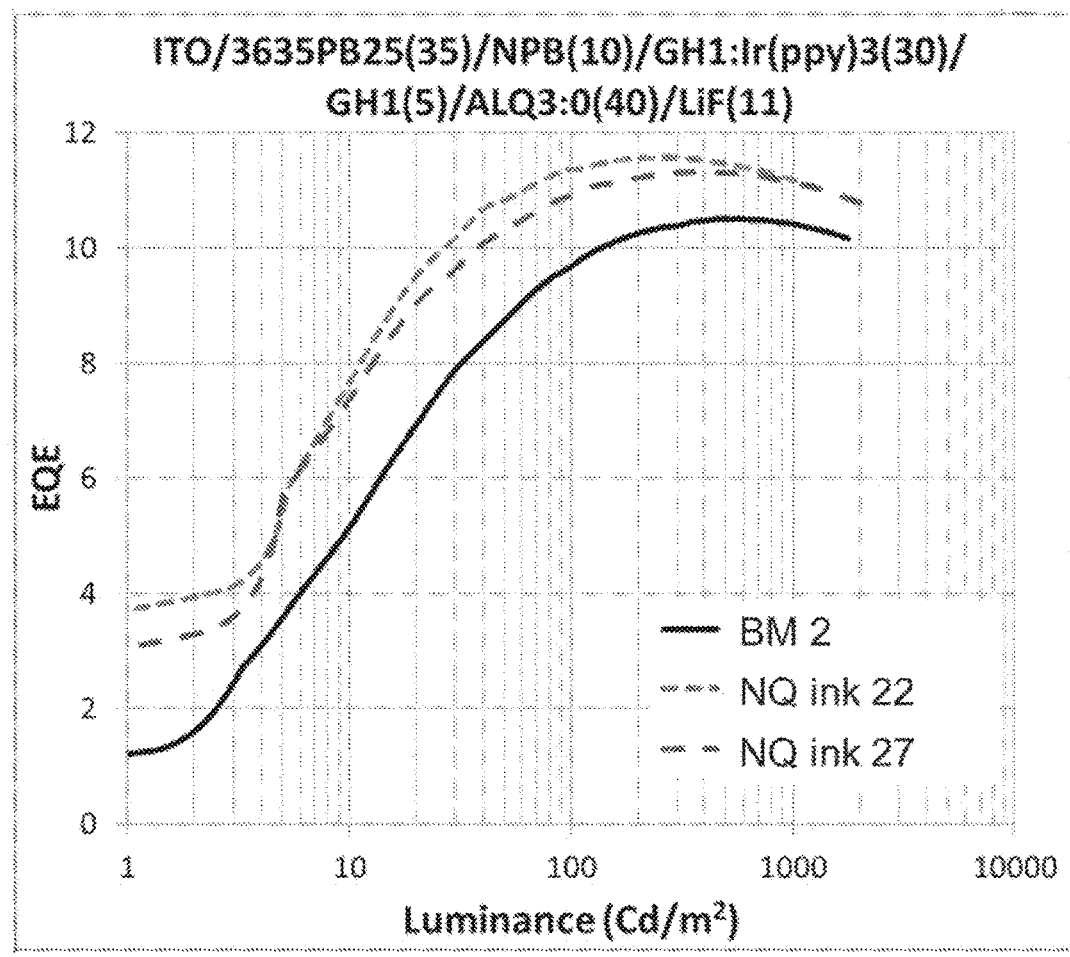
FIG. 10 shows luminance dependence of EQE in Green PHOLED devices made from NQ HIL inks 22 and 27 in comparison with that of devices made from BM 2.

FIG. 10 shows luminance dependence of EQE in Green PHOLED devices made from NQ HIL inks 22 and 27 in comparison with that of devices made from BM 2. It is clearly seen the HIL made from ink 22 shows highest EQE over a broad luminance range, especially from 10 nits to 1000 nits and low roll-off at high luminances.

Figure 11:
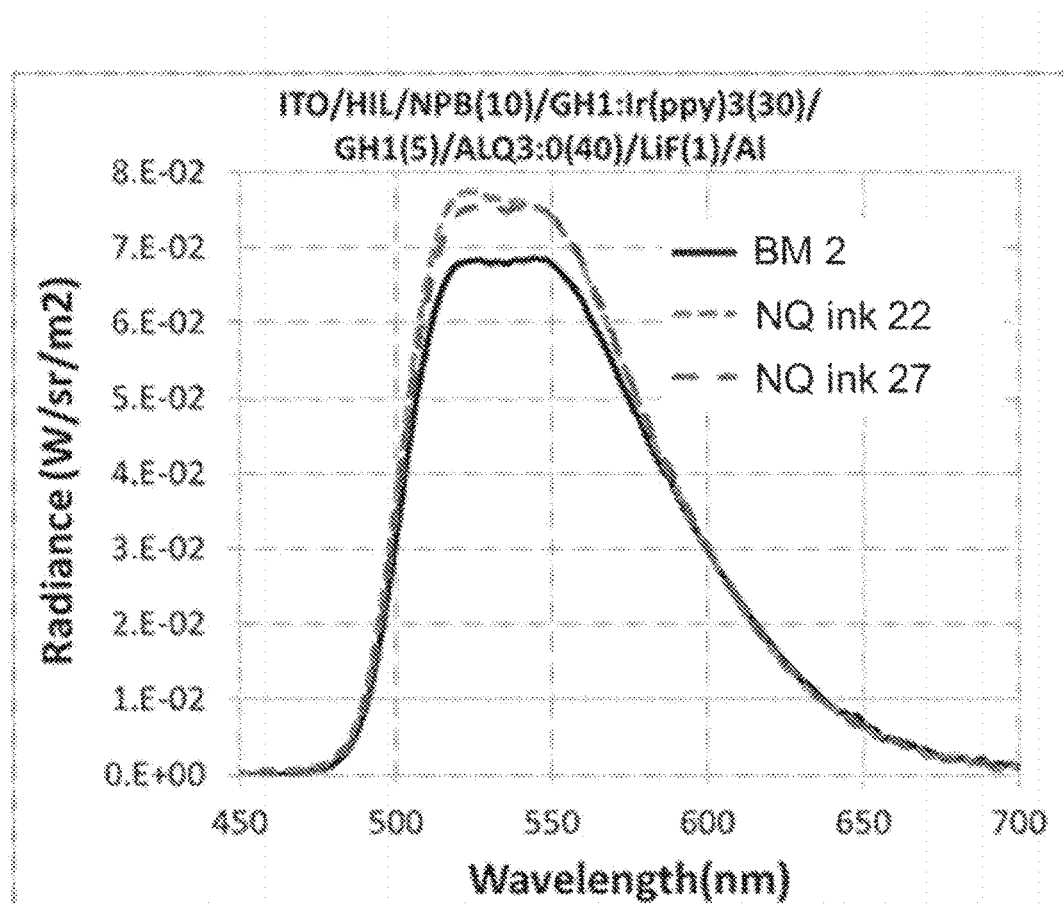
FIG. 11 shows the electroluminescence spectra of Green PHOLED devices with made from NQ HIL inks 22 and 27 in comparison with that of devices made from BM 2.

FIG. 11 shows the electroluminescence spectra of Green PHOLED devices with made from NQ HIL inks 22 and 27 in comparison with that of devices made from BM 2. The Green devices with HIL made from BM 2 ink showed a large red shift that may have been caused by large leakage current.

Figure 12:
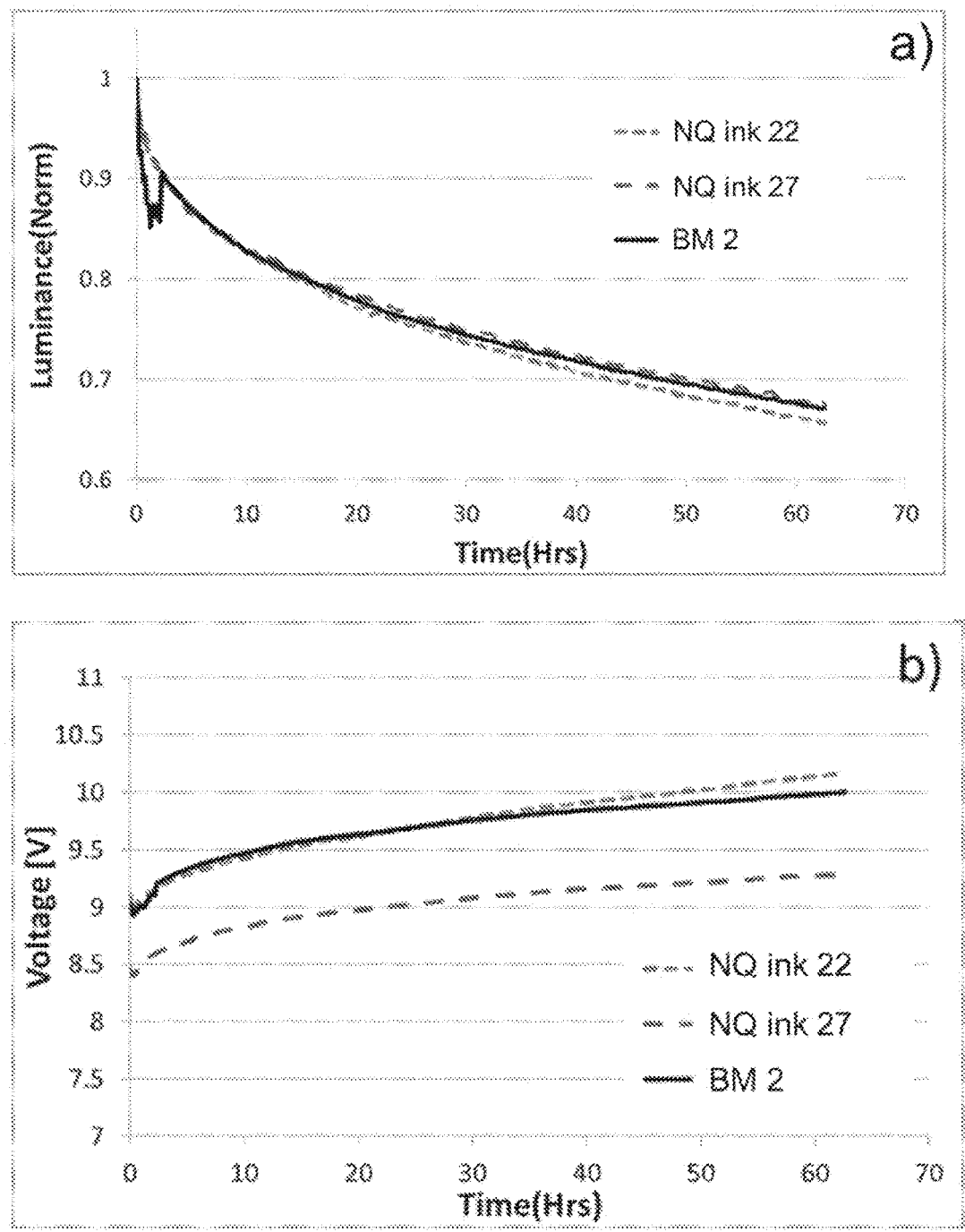
FIG. 12 shows (a) luminance decay and (b) the voltage rise in Green PHOLED devices with made from NQ HIL inks 22 and 27 in comparison with that of devices made from BM 2.

FIG. 12*a* shows luminance decay and FIG. 12*b* shows the voltage rise in Green PHOLED devices with made from NQ HIL inks 22 and 27 in comparison with that of devices made from BM 2. As seen in FIG. 12*b*, the device made from NQ ink 27 showed the smallest voltage rise.

What is claimed is:

1. A non-aqueous ink composition comprising:
   (a) a polythiophene comprising a repeating unit complying with formula (I)

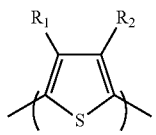

wherein R$_1$ and R$_2$ are each, independently, H, alkyl, fluoroalkyl, alkoxy, aryloxy, or —O—[Z—O]$_p$—R$_e$;
   wherein
   Z is an optionally halogenated hydrocarbylene group,
   p is equal to or greater than 1, and
   R$_e$ is H, alkyl, fluoroalkyl, or aryl; or
   wherein R$_1$ is a sulfonic acid group (—SO$_3$H) and R$_2$ is alkyl, fluoroalkyl, alkoxy, aryloxy, or —O—[Z—O]$_p$—R$_e$;
   wherein Z, p and R$_e$ have the same meanings as defined above;
   (b) one or more metallic nanoparticles; wherein the amount of the metallic nanoparticles is from 1 wt. % to 90 wt. %, relative to the combined weight of the metallic nanoparticles and the doped polythiophene and undoped polythiophene, and
   (c) a liquid carrier comprising one or more organic solvents.

2. The non-aqueous ink composition according to claim 1, wherein R$_1$ and R$_2$ are each, independently, H, fluoroalkyl, or —O[C(R$_a$R$_b$)—C(R$_c$R$_d$)—O]$_p$—R$_e$; wherein each occurrence of R$_a$, R$_b$, R$_c$, and R$_d$, is each, independently, H, halogen, alkyl, fluoroalkyl, or aryl; R$_e$ is H, alkyl, fluoroalkyl, or aryl; p is 1, 2, or 3, or —OR$_f$, wherein R$_f$ is alkyl or aryl, or
   wherein R$_1$ is a sulfonic acid group (—SO$_3$H) and R$_2$ is fluoroalkyl, or —O[C(R$_a$R$_b$)—C(R$_c$R$_d$)—O]$_p$—R$_e$, wherein R$_a$, R$_b$, R$_c$, R$_d$, R$_e$, and p have the same meanings as defined above, or —OR$_f$, wherein R$_f$ has the same meaning as defined above.

3. The non-aqueous ink composition according to claim 2, wherein each occurrence of R$_a$, R$_b$, R$_c$, and R$_d$, is each, independently, H, (C$_1$-C$_8$)alkyl, (C$_1$-C$_8$)fluoroalkyl, or phenyl; and R$_e$ is (C$_1$-C$_8$)alkyl, (C$_1$-C$_8$)fluoroalkyl, or phenyl.

4. The non-aqueous ink composition according to claim 1, wherein R$_1$ is H and R$_2$ is other than H or R$_1$ and R$_2$ are both other than H.

5. The non-aqueous ink composition according to claim 1, wherein the repeating unit comprises at least one unit selected from the group consisting of formulae (I-1a) to (I-III) below:

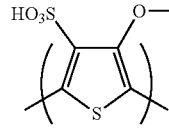

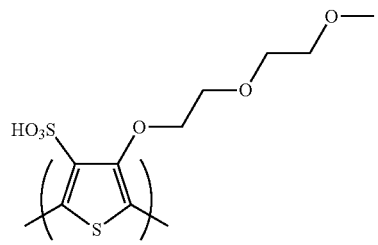

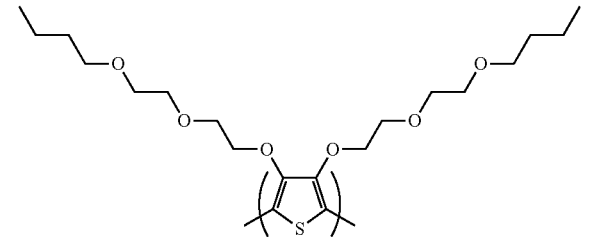

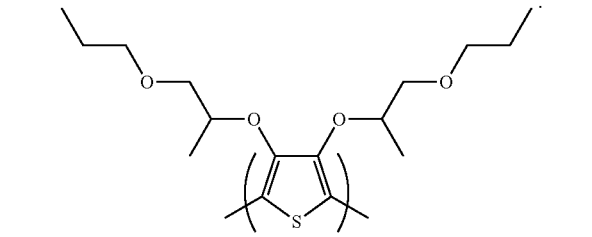

6. The non-aqueous ink composition according to claim 5, wherein the repeating unit comprises at least one unit selected from the group consisting of formulae (I-II) and (I-III).

7. The non-aqueous ink composition according to claim 1, wherein the polythiophene comprising a repeating unit complying with formula (I) is doped with a dopant.

8. The non-aqueous ink composition according to claim 7, wherein the dopant comprises a tetraarylborate.

9. The non-aqueous ink composition according to claim 1, wherein the one or more metallic nanoparticles comprise a transition metal oxide.

10. The non-aqueous ink composition according to claim 9, wherein the one or more metallic nanoparticles comprise zirconium oxide (ZrO$_2$), titanium dioxide (TiO$_2$), zinc oxide (ZnO), vanadium(V) oxide (V$_2$O$_5$), molybdenum trioxide (MoO$_3$), tungsten trioxide (WO$_3$), or mixtures thereof.

11. The non-aqueous ink composition according to claim 9, wherein the metallic nanoparticles comprise one or more organic capping groups.

12. A process for forming a hole-carrying film, the process comprising:
   1) coating a substrate with a non-aqueous ink composition according to claim 1; and
   2) annealing the coating on the substrate, thereby forming the hole-carrying film.

13. A hole-carrying film formed by the process according to claim 12.

14. The hole-carrying film according to claim 13, wherein the film has a transmittance of at least 85% of light having a wavelength of about 380-800 nm.

15. The hole-carrying film according to claim 13, wherein the film has a thickness of from 5 nm to 500 nm.

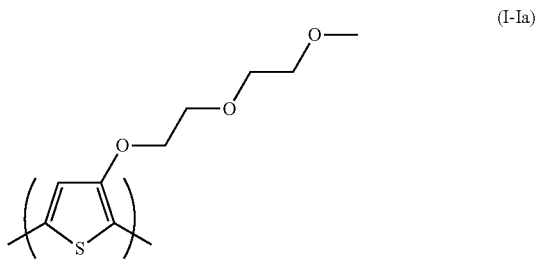

16. A device comprising the hole-carrying film according to claim 13, wherein the device is an OLED, OPV, transistor, capacitor, sensor, transducer, drug release device, electrochromic device, or battery device.

17. The device according to claim 16, wherein the device is an OLED, OPV, transistor, capacitor, sensor, transducer, drug release device, electrochromic device, or battery device.

18. The process according to claim 12, wherein the annealing temperature is from 25° C. to 300° C.

19. The non-aqueous ink composition according to claim 1, wherein the total amount of water present in the liquid carrier is from 0 to 5% wt.

20. The non-aqueous ink composition according to claim 1, wherein the liquid carrier consists of one or more organic solvents.

21. The non-aqueous ink composition according to claim 1, wherein the liquid carrier consists of two or more organic solvents.

22. A non-aqueous ink composition comprising:
(a) a polythiophene comprising a repeating unit complying with formula (I)

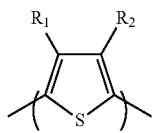

(I)

wherein $R_1$ and $R_2$ are each, independently, H, alkyl, fluoroalkyl, alkoxy, aryloxy, or —O—[Z—O]$_p$—$R_e$;
wherein
Z is an optionally halogenated hydrocarbylene group,
p is equal to or greater than 1, and
$R_e$ is H, alkyl, fluoroalkyl, or aryl; or
wherein $R_1$ is a sulfonic acid group (—SO$_3$H) and $R_2$ is alkyl, fluoroalkyl, alkoxy, aryloxy, or —O—[Z—O]$_p$—$R_e$;
wherein Z, p and $R_e$ have the same meanings as defined above;
(b) one or more metallic nanoparticles; wherein the one or more metallic nanoparticles comprise a transition metal oxide and wherein the metallic nanoparticles comprise one or more organic capping groups; and
(c) a liquid carrier comprising one or more organic solvents.

23. A non-aqueous ink composition comprising:
(a) a polythiophene comprising a repeating unit complying with formula (I)

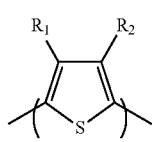

(I)

wherein $R_1$ and $R_2$ are each, independently, H, alkyl, fluoroalkyl, alkoxy, aryloxy, or —O—[Z—O]$_p$—$R_e$;
wherein
Z is an optionally halogenated hydrocarbylene group,
p is equal to or greater than 1, and
$R_e$ is H, alkyl, fluoroalkyl, or aryl; or
wherein $R_1$ is a sulfonic acid group (—SO$_3$H) and $R_2$ is alkyl, fluoroalkyl, alkoxy, aryloxy, or —O—[Z—O]$_p$—$R_e$;
wherein Z, p and $R_e$ have the same meanings as defined above;
(b) one or more metallic nanoparticles; wherein the total amount of water present in the liquid carrier is from 0 to 5% wt, and
(c) a liquid carrier comprising one or more organic solvents.

* * * * *